(12) United States Patent
Kasai et al.

(10) Patent No.: US 11,342,314 B2
(45) Date of Patent: May 24, 2022

(54) LIGHT-EMITTING MODULE

(71) Applicant: NICHIA CORPORATION, Anan (JP)

(72) Inventors: Daisuke Kasai, Tokushima (JP); Tadao Hayashi, Tokushima (JP); Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/151,904

(22) Filed: Jan. 19, 2021

(65) Prior Publication Data

US 2021/0167048 A1 Jun. 3, 2021

Related U.S. Application Data

(63) Continuation of application No. 16/529,309, filed on Aug. 1, 2019, now Pat. No. 10,930,624.

(30) Foreign Application Priority Data

| Aug. 3, 2018 | (JP) | JP2018-147089 |
| Nov. 28, 2018 | (JP) | JP2018-222422 |
| Mar. 20, 2019 | (JP) | JP2019-053562 |

(51) Int. Cl.
*H01L 25/075* (2006.01)
*H01L 33/60* (2010.01)
(Continued)

(52) U.S. Cl.
CPC ........ *H01L 25/0753* (2013.01); *G02B 6/0021* (2013.01); *G02B 6/0025* (2013.01);
(Continued)

(58) Field of Classification Search
CPC ..... H01L 25/753; H01L 33/44; H01L 33/507; H01L 33/60; H01L 33/486;
(Continued)

(56) References Cited

U.S. PATENT DOCUMENTS

2006/0097291 A1  5/2006  Takahashi et al.
2007/0267643 A1  11/2007  Harada et al.
(Continued)

FOREIGN PATENT DOCUMENTS

JP  2005038776 A  2/2005
JP  2007311445 A  11/2007
(Continued)

*Primary Examiner* — Thinh T Nguyen
(74) *Attorney, Agent, or Firm* — Hunton Andrews Kurth LLP

(57) ABSTRACT

A light-emitting module includes a light-emitting element unit including a light-emitting element, a light-transmissive member covering a main light-emitting surface of the light-emitting element, and a first light-reflective member covering lateral surfaces of the light-emitting element; a light-transmissive light-guiding plate having a first main surface and a second main surface having a recess accommodating the light-emitting element unit; a second light-reflective member covering the second main surface and the light-emitting element unit; and a light-transmissive bonding member disposed in contact with inner lateral surfaces of the recess and outer lateral surfaces of the light-emitting element unit. At least a portion of the first light-reflective member is located outside the recess in a cross-sectional view, and is in contact with the light-transmissive bonding member. The light-transmissive bonding member has an inclined surface forming an acute angle with a corresponding outer lateral surface of the first light-reflective member.

15 Claims, 19 Drawing Sheets

(51) Int. Cl.
H01L 33/50 (2010.01)
F21V 8/00 (2006.01)

(52) U.S. Cl.
CPC ......... *G02B 6/0031* (2013.01); *G02B 6/0078* (2013.01); *H01L 33/507* (2013.01); *H01L 33/60* (2013.01); *G02B 6/0016* (2013.01); *H01L 2933/0058* (2013.01); *H01L 2933/0083* (2013.01)

(58) Field of Classification Search
CPC .... H01L 2933/0058; H01L 2933/0083; G02B 6/0021; G02B 6/0025
USPC .............................. 257/88.98; 438/22, 24, 25
See application file for complete search history.

(56) References Cited

U.S. PATENT DOCUMENTS

| | | |
|---|---|---|
| 2010/0008628 A1 | 1/2010 | Shani |
| 2014/0376219 A1* | 12/2014 | Ono et al. ............. F21V 7/0025 362/235 |
| 2015/0036317 A1 | 2/2015 | Yamamoto et al. |
| 2018/0108815 A1 | 4/2018 | Hayashi |
| 2018/0212128 A1 | 7/2018 | Hayashi |
| 2019/0018184 A1 | 1/2019 | Miyashita et al. |
| 2020/0043903 A1 | 2/2020 | Kasai et al. |

FOREIGN PATENT DOCUMENTS

| | | |
|---|---|---|
| JP | 2009140663 A | 6/2009 |
| JP | 2011210674 A | 10/2011 |
| JP | 2012146942 A | 8/2012 |
| JP | 2015032373 A | 2/2015 |
| JP | 2016115703 A | 6/2016 |
| JP | 2018067630 A | 4/2018 |
| JP | 2018097974 A | 6/2018 |
| JP | 2018120923 A | 8/2018 |
| JP | 2018133304 A | 8/2018 |
| WO | 2017122794 A1 | 7/2017 |

* cited by examiner

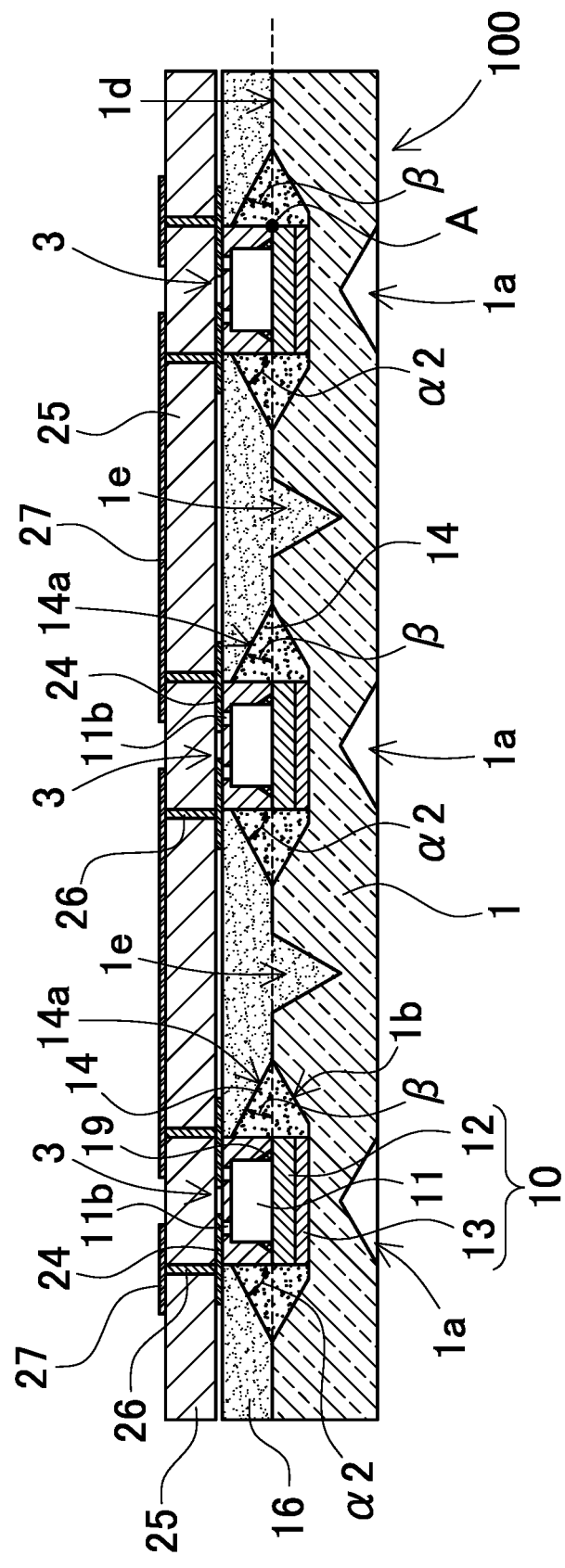

LIGHT-EMITTING MODULE

CROSS-REFERENCE TO RELATED APPLICATION

This is a continuation application of U.S. patent application Ser. No. 16/529,309, filed Aug. 1, 2019, which claims priority to Japanese Patent Application No. 2018-147089, filed on Aug. 3, 2018, Japanese Patent Application No. 2018-222422, filed on Nov. 28, 2018, and Japanese Patent Application No. 2019-053562, filed on Mar. 20, 2019, the contents of which are hereby incorporated by reference in their entireties.

BACKGROUND OF THE INVENTION

1. Field of the Invention

The present disclosure relates to a light-emitting module including light-emitting elements.

2. Description of Related Art

Light-emitting devices including light-emitting elements such as light-emitting diodes are widely used for backlight devices for liquid-crystal display devices, and various light sources for display devices and the like.

For example, a light source device described in Japanese Patent Publication No. 2015-32373 includes a plurality of light-emitting elements mounted on a mounting substrate, hemispherical lens members each sealing a respective one of the light-emitting elements, and a diffusion member that is disposed above and receives light emitted from the light-emitting elements.

In a light-emitting device described in Japanese Patent Publication No. 2016-115703, a two-layer sheet, including a sealing resin layer and a phosphor layer, is disposed on the upper surface of a light-emitting element, and the lateral surfaces of the two-layer sheet are covered with a reflective resin.

Such light-emitting devices have high directivity, which tends to allow a luminance of a particular portion to be higher than a luminance of another portion, resulting in unevenness in luminance.

One object of the present invention is to provide a light-emitting module that may have light-emitting characteristics in which unevenness in luminance is reduced.

SUMMARY

A light-emitting module according to one embodiment of the present invention includes a light-emitting element unit including a light-emitting element, a light-transmissive member covering a main light-emitting surface of the light-emitting element, and a first light-reflective member covering lateral surfaces of the light-emitting element; a light-transmissive light-guiding plate including a first main surface serving as a light-emitting surface, and a second main surface opposite to the first main surface and having a recess accommodating the light-emitting element unit; a second light-reflective member covering the second main surface of the light-transmissive light-guiding plate and the light-emitting element unit; and a light-transmissive bonding member disposed in contact with inner lateral surfaces of the recess and outer lateral surfaces of the light-emitting element unit. At least a portion of the first light-reflective member is located outside the recess in a sectional view, and is in contact with the light-transmissive bonding member. The light-transmissive bonding member has an inclined surface forming an acute angle with a corresponding outer lateral surface of the first light-reflective member.

With a light-emitting module according to one embodiment of the present invention, radiation characteristics of light may be controlled, so that unevenness in luminance may be reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, in which:

FIG. 22 is a schematic cross-sectional view of a light-emitting module according to still another modified example.

DETAILED DESCRIPTION

Figure 1:
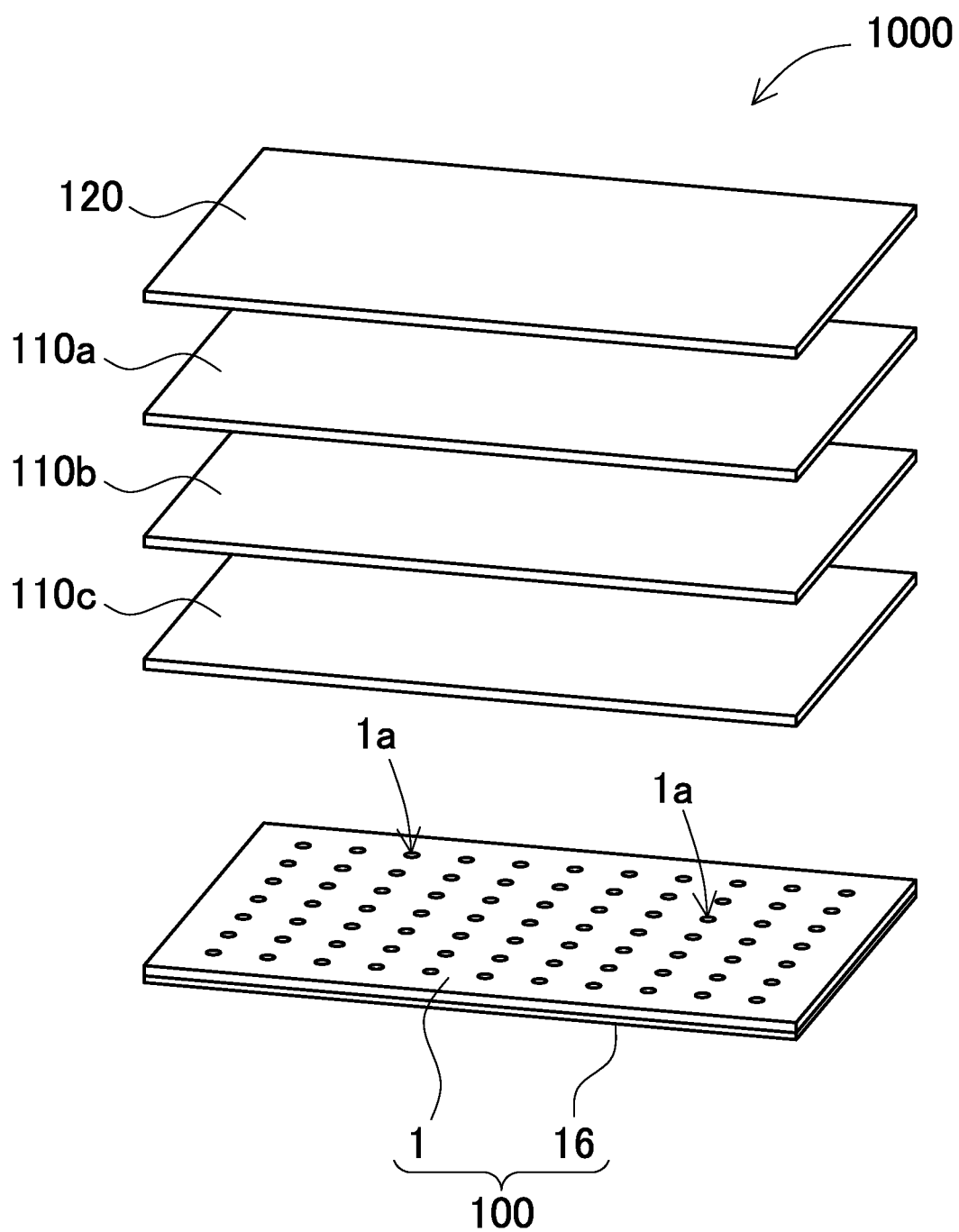
FIG. 1 is a schematic diagram showing the structure of a liquid-crystal display device according to certain embodiments.

Certain embodiments of the present invention will be described below in detail on the basis of the accompanying drawings. The descriptions below include terms indicating specific directions or positions (such as "up", "down", and other terms containing these terms) as appropriate. These terms are used to facilitate understanding of the invention referring to the drawings, and the meanings of these terms do not limit the technical scope of the present invention. A portion with the same reference numeral in a plurality of drawings represents the same or equivalent portion or member.

In the embodiments described below, examples of light-emitting modules are described to give concrete form to the technical idea of the present invention, and the present invention is not limited to the description below. Unless otherwise specified, sizes, materials, shapes, and relative positions of constituent components described below are not intended to limit the scope of the present invention thereto, but rather are described as examples. Constitutions described in one embodiment may be applicable to other embodiments. Sizes or positional relationships of components illustrated in the drawings may be exaggerated in order to clarify the descriptions.

Liquid-Crystal Display Device 1000

FIG. 1 is a schematic diagram showing the structure of a liquid-crystal display device 1000 including a light-emitting module. The liquid-crystal display device 1000 includes a liquid-crystal panel 120, two lens sheets 110a and 110b, a diffusion sheet 110c, and a light-emitting module 100 in the order from the top. The liquid-crystal display device 1000 shown in FIG. 1 is what is called a direct-type liquid-crystal display device in which the light-emitting module 100 is disposed below the liquid-crystal panel 120. In the liquid-crystal display device 1000, the liquid-crystal panel 120 is irradiated with light emitted from the light-emitting module 100. Other members such as a polarizing film and a color filter may be included in addition to the components described above.

Light-Emitting Module 100

Figure 2:
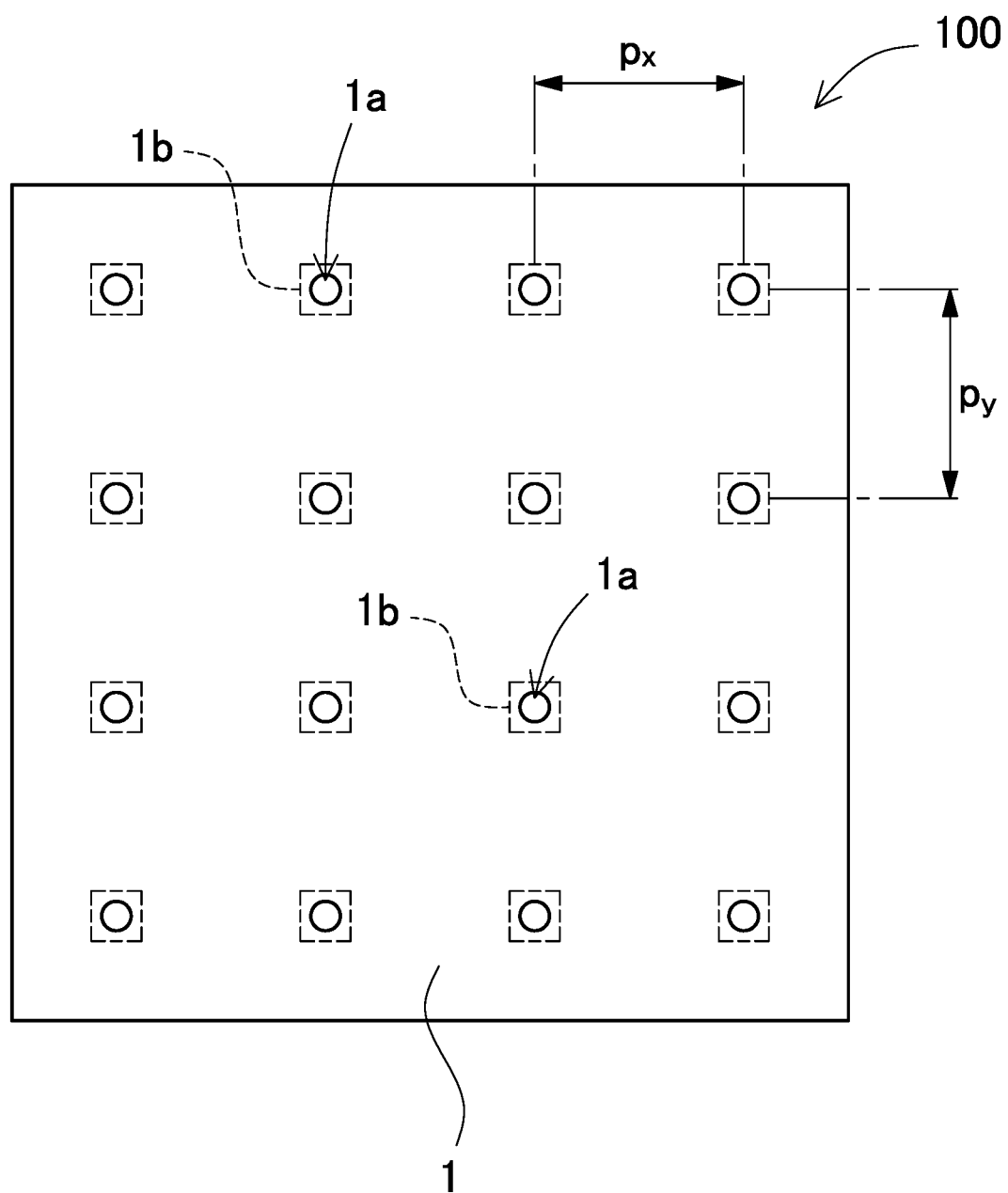
FIG. 2 is a schematic plan view of a light-emitting module according to a first embodiment.
Figure 3:
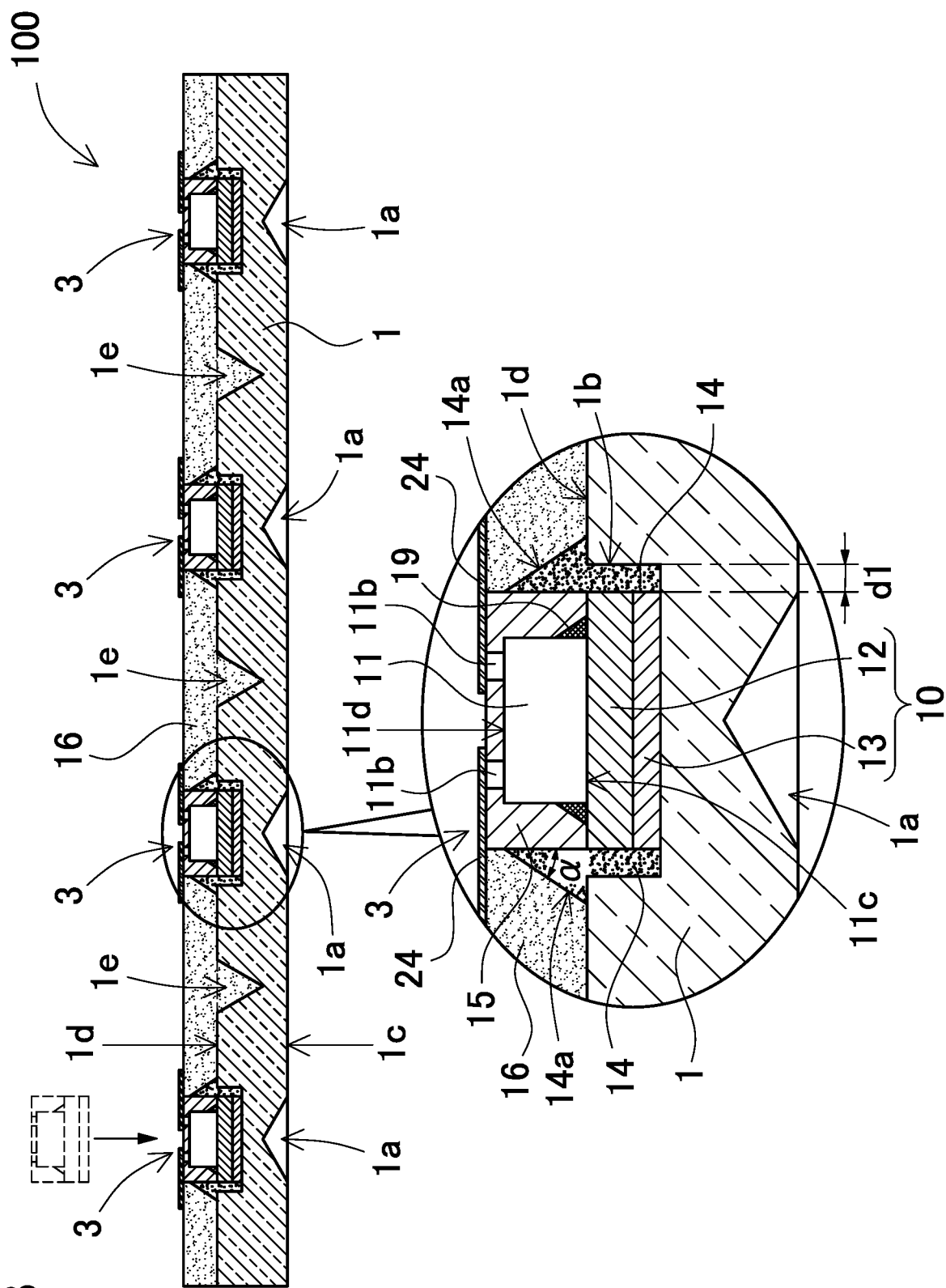
FIG. 3 is a schematic enlarged cross-sectional view of a portion of the light-emitting module according to the first embodiment viewed upside down such that a light-guiding plate faces downward.

FIG. 2 and FIG. 3 show the structure of the light-emitting module 100 of a first embodiment of the present disclosure. The light-emitting module 100 of the present embodiment is a surface-emitting module configured to emit white light. FIG. 2 is a schematic plan view of the light-emitting module according to the present embodiment. FIG. 3 is a schematic enlarged cross-sectional view of a portion of the light-emitting module according to the present embodiment. The light-emitting module 100 shown in these drawings includes light-emitting element units 3, serving as light sources, and a light-guiding plate 1 that has a first main surface 1c, serving as the light-emitting surface for radiating light to the outside, and a second main surface 1d, having recesses 1b in which the light-emitting element units 3 are disposed.

The light-emitting module 100 further includes a second light-reflective member 16 covering a portion of the second main surface 1d of the light-guiding plate 1 and a portion of each of the light-emitting element units 3. The light-emitting module 100 still further includes light-transmissive bonding members 14, each of which is in contact with inner lateral surfaces of a respective one of the recesses 1b and outer lateral surfaces of a respective one of the light-emitting element units 3.

In the light-emitting module 100 shown in FIG. 2 and FIG. 3, one light-guiding plate 1 defines a plurality of recesses 1b, and each of the light-emitting element units 3 is disposed in a respective one of the recesses 1b. Other examples of the light emitting module include a light-emitting module 100' as shown in the schematic bottom view of FIG. 4, in which a plurality of light-guiding plates 1', each defining a single recess 1b in which a respective one of the light-emitting element units 3 is disposed, are arranged to constitute the light-emitting module 100'.

Light-Emitting Element Unit 3

Each light-emitting element unit 3 includes a light-emitting element 11, a light-transmissive member 10 covering a main light-emitting surface 11c of the light-emitting element 11, and a first light-reflective member 15 covering the lateral surfaces of the light-emitting element 11.

The light-emitting element 11 has the main light-emitting surface 11c, an electrode formation surface 11d opposite to the main light-emitting surface 11c, and the lateral surfaces between the main light-emitting surface 11c and the electrode formation surface 11d. In addition, a plurality of element electrodes 11b are disposed on the electrode formation surface 11d.

The light-emitting element 11 radiates light mainly from the main light-emitting surface 11c to the light-transmissive member 10 covering the main light-emitting surface 11c.

In the light-emitting element unit 3 shown in FIG. 3, the light-transmissive member 10 covers the main light-emitting surface 11c of the light-emitting element 11.

Also, in the light-emitting element unit 3, the first light-reflective member 15 covers the lateral surfaces of the light-emitting element 11. In the light-emitting element unit 3 shown in the drawings, each of outer lateral surfaces of the first light-reflective member 15 and a corresponding one of outer lateral surfaces of the light-transmissive member 10 are in the same plane.

Light-Emitting Element 11

The light-emitting element 11 has the electrode formation surface 11d provided with the positive and negative element electrodes 11b, and the main light-emitting surface 11c opposite to the electrode formation surface 11d. In the light-emitting module of the present embodiment, the light-emitting element 11 may be flip-chip mounted or may be electrically connected using wires.

The light-emitting element 11 includes, for example, a light-transmissive substrate such as a sapphire substrate and a semiconductor layered structure layered on the light-transmissive substrate. The semiconductor layered structure includes an n-type semiconductor layer, a p-type semiconductor layer, and a light-emitting layer between the n-type semiconductor layer and the p-type semiconductor layer. The n-type and p-type semiconductor layers are electrically connected to n-side and p-side electrodes, which are the element electrodes 11b, respectively. In the light-emitting element 11, for example, the main light-emitting surface 11c, provided with the light-transmissive substrate, faces the light-guiding plate 1, and the electrode formation surface 11d opposite to the main light-emitting surface 11c is provided with the plurality of element electrodes 11b.

The light-emitting element 11 may have any appropriate length, width, and height. A semiconductor light-emitting element having length and width of preferably 1000 μm or less, more preferably 500 μm or less, further preferably 200 μm or less, in a plan view may be used. With such a light-emitting element, local dimming of the liquid-crystal display device allows for obtaining high-definition images. Further, using a light-emitting element having length and width of 500 μm or less allows for obtaining the light-emitting element at a low price, so that the light-emitting module 100. A light-emitting element having length and width dimensions that are both 250 μm or less has a small area of the upper surface of the light-emitting element, so that an amount of light emitted from the lateral surfaces of the light-emitting element is relatively increased. That is, light emitted from such a light-emitting element is likely to have a batwing distribution, and such a light-emitting element is therefore preferably used in the light-emitting module of the present embodiment in which the light-emitting element is bonded to the light-guiding plate such that the distance between the light-emitting element and the light-guiding plate is greatly reduced.

The height of the light-emitting element 11 is preferably in a range of 0.10 mm to 0.25 mm. The light-emitting element 11 preferably has such a height that allows the electrode formation surface 11d of the light-emitting element 11 protrudes from the recess 1b when the light-emitting element unit 3 is mounted in the recess 1b.

The light-emitting element 11 may have any appropriate shape, such as a square shape or an elongated rectangular shape, in a plan view. It is preferable that a light-emitting element used in a high-definition liquid-crystal display device have an elongated rectangular shape in a plan view, with an upper surface having long sides and short sides. For a high-definition liquid-crystal display device, several thousand or more light-emitting elements are used, and accordingly, mounting of the light-emitting elements is required to be appropriately performed. With light-emitting elements each having an elongated rectangular shape in a plan view, even if rotational misalignment (such as misalignment in ±90° directions) of some of the light-emitting elements occur in the step of mounting the light-emitting elements, such rotational misalignment can be easily detected by visual observation. Further, the p-side electrodes and the n-side electrodes may be formed away from each other, so that formation of wiring described below may be easily performed. On the other hand, when light-emitting elements each having a square shape in a plan view are used, small light-emitting elements may be manufactured with a good mass-productivity. The density (intervals) of the light-emitting elements 11, in other words, distances between the light-emitting elements 11, can be, for example, in a range of about 0.05 mm to 20 mm, preferably about 1 mm to 10 mm. An interval between light-emitting elements 11 refers to a distance between the centers of two adjacent light-emitting elements 11. Each of the light-emitting elements 11 is designed to be disposed substantially at the center of a respective one of the light-emitting units 3, so that the intervals between the light-emitting units 3 are also in a range of about 0.06 mm to 20 mm, preferably about 1 mm to 10 mm.

A known semiconductor light-emitting element may be used for each light-emitting element 11. In the present embodiment, a case of using a flip-chip mounted light-emitting diode, as an example of the light-emitting element 11, is described. The light-emitting element 11 emits, for example, blue light. An element that emits light other than blue light may be also used as the light-emitting element 11. Each light emitting unit 3 may include a plurality of light-emitting elements 11, and light-emitting elements that emit light having different colors may be used as the plurality of light-emitting elements 11. A color (such as blue) of light emitted from the light-emitting element 11 and a color (such as yellow) of light that has been subjected to wavelength conversion by a wavelength conversion member 12 are mixed to generate white light, which is radiated from the light-emitting element unit 3.

An element that emits light with any appropriate wavelength may be selected as the light-emitting element 11. Examples of elements that emit blue and green light include a light-emitting element including a nitride semiconductor ($In_XAl_YGa_{1-X-Y}N$, where $0 \leq X$, $0 \leq Y$, and $X+Y \leq 1$) or GaP. A light-emitting element containing a semiconductor such as GaAlAs and AlInGaP may be used as an element that emits red light. Alternatively, semiconductor light-emitting elements made of materials other than the materials described above may be used. The emission wavelengths may be changed by changing the materials for the semiconductor layers and their mixing ratios. The compositions, emission colors, sizes, and numbers of the light-emitting elements to be used may be appropriately selected according to the purpose.

Light-Transmissive Member 10

The light-transmissive member 10 covers the main light-emitting surface 11c of the light-emitting element 11 and transmits light emitted from the main light-emitting surface 11c. The light-transmissive member 10 may contain a substance adapted to be excited by light emitted from the light-emitting element 11 or may contain a substance that diffuses or/and reflects the light. The light-transmissive member 10 shown in FIG. 3 includes the wavelength conversion member 12 and a light-diffusing member 13 layered on the wavelength conversion member 12. In the light-transmissive member 10 shown in the drawings, the wavelength conversion member 12 is layered at a light-emitting element 11 side, and the light-diffusing member 13 is layered at a light-guiding plate 1 side. In the light-transmissive member 10, the wavelengths of light emitted from the light-emitting element 11 is adjusted in the wavelength conversion member 12, and light transmitted through the wavelength conversion member 12 is diffused in the light-diffusing member 13 before the light is irradiated on the light-guiding plate 1. This structure allows light radiated from the light-guiding plate 1 to be more uniform.

In the light-emitting element unit 3 shown in FIG. 3, the light-transmissive member 10 including the wavelength conversion member 12 and the light-diffusing member 13 is bonded to the light-emitting element 11. The light-transmissive member 10 preferably includes the wavelength conversion member 12 and the light-diffusing member 13 as described above. In the light-transmissive member 10, a plurality of wavelength conversion members 12 or light-diffusing members 13 may be layered. The light-transmissive member 10 may be composed of only the wavelength conversion member, only the light-diffusing member, or only a light-transmissive resin without the light-transmissive member or the light-diffusing member. The light-transmissive member 10 preferably has a thickness in a range of 0.05 mm to 0.30 mm. If a thickness of the light-transmissive member is too small, the effect of wavelength conversion and light diffusion may not be easily obtained. If a thickness of the light-transmissive member is too large, absorption of wavelength-converted light, saturation of the effect of light diffusion, or the like may occur. Accordingly, a thickness of the light-transmissive member 10 including the wavelength conversion member 12 and the light-diffusing member 13 is preferably in the range described above. The wavelength conversion member 12 preferably has a thickness in a range of 0.02 mm to 0.30 mm.

Wavelength Conversion Member 12

The wavelength conversion member 12 receives light emitted from the light-emitting element 11 and converts the light into light with different wavelengths. In the wavelength conversion member 12, a wavelength conversion substance is dispersed in a base material. The wavelength conversion member 12 may include a plurality of layers. For example, the wavelength conversion member 12 may have a two-layer structure including a first layer, in which a wavelength conversion substance is added to a base material, and a second layer, which is the light-diffusing member in which a diffusing material is added to a base material.

Examples of a material of the base material include a light-transmissive material such as epoxy resins, silicone resins, mixtures two or more of these resins, and glass. It may be effective to select a silicone resin as the base material in view of resistance to light and ease of formation of the wavelength conversion member. For the base material of the wavelength conversion member 12, a material having a refractive index higher than a refractive index of the material of the light-guiding plate 1 is preferably used.

Examples of the wavelength conversion substance contained in the wavelength conversion member 12 include a phosphor. Examples of the phosphor include YAG phosphors, β-SiAlON phosphors, and fluoride phosphors, such as KSF phosphors. The wavelength conversion member 12 may contain a single wavelength conversion substance or a plurality of wavelength conversion substances. When the wavelength conversion member 12 contains a plurality of wavelength conversion substances, for example, the wavelength conversion member 12 may contain a β-SiAlON phosphor that emits light having a color in the green range and a fluoride phosphor, such as a KSF phosphor, that emits light having a color in the red range. This structure allows for expanding the color reproduction range of the light-emitting module 100. In this case, the light-emitting element 11 preferably contains a nitride semiconductor ($In_XAl_YGa_{1-X-Y}N$, where $0 \leq X$, $0 \leq Y$, and $X+Y \leq 1$), which is adapted to emit light with a short wavelength that may efficiently excite the wavelength conversion member 12. In the case of using, for example, a light-emitting element 11 configured to emit light having a color in the blue range to obtain a light-emitting module that emits light having a color in the red range, the wavelength conversion member 12 may contain 60 wt % or more, preferably 90 wt % or more, of a KSF phosphor (i.e., red phosphor). That is, the wavelength conversion member 12 may contain a wavelength conversion substance adapted to emit light having a predetermined color to emit light having a predetermined color. For the wavelength conversion substance, quantum dots may be used. The wavelength conversion substance may be disposed in any appropriate arrangement inside the wavelength conversion member 12. For example, the wavelength conversion substance may be substantially uniformly distributed or predominantly disposed in a portion of the wavelength conversion substance. Also, a plurality of layers each containing a wavelength conversion member may be layered.

Light-Diffusing Member 13

The light-diffusing member 13 diffuses and/or reflects light emitted from the light-emitting element 11 to reduce concentration of light on the main light-emitting surface 11c, which allows for reducing unevenness in luminance. In the light-diffusing member 13, a diffusing material is added to a base material. Examples of the light-diffusing member 13 include a member in which white inorganic fine particles such as $SiO_2$ and $TiO_2$ are added to a resin material described above, serving as the base material. For the diffusing material, a light-reflective white resin or a metal formed into fine particles may be used. The diffusing material is irregularly distributed in the base material, and thus irregularly and repeatedly reflects light passing through the light-diffusing member to diffuse the transmitted light in multiple directions, which allows for reducing local concentration of irradiation light, so that unevenness in luminance may be reduced.

The light-diffusing member may have a reflectance of 60% or more, preferably 90% or more, of light emitted from the light-emitting element 11.

In the light-emitting element unit 3 shown in FIG. 3, the outer shape of the light-transmissive member 10 including the wavelength conversion member 12 and the light-diffusing member 13 is larger than the outer shape of the light-emitting element 11 in a plan view. With the light-emitting element unit 3 having such a structure, a larger portion of light emitted from the main light-emitting surface 11c of the light-emitting element 11 may be transmitted through the wavelength conversion member 12 and the light-diffusing member 13 and may be incident on the light-guiding plate 1, so that unevenness in emission color and unevenness in luminance may be reduced.

Light-Transmissive Adhesive Member 19

As shown in FIG. 3, a portion of the lateral surfaces of the light-emitting element 11 and a portion of the light-transmissive member 10 may be covered with a light-transmissive adhesive member 19. An outer lateral surface of the light-transmissive adhesive member 19 is preferably an inclined surface that spreads from a lateral surface of the light-emitting element 11 toward the light-transmissive member 10, more preferably a convex curved surface protruding toward the light-emitting element 11. With this structure, a larger portion of light emitted from the lateral surface of the light-emitting element 11 may be guided to the light-transmissive member 10, so that the light extraction efficiency may be increased.

The light-transmissive adhesive member 19 may be disposed between the main light-emitting surface 11c of the light-emitting element 11 and the light-transmissive member 10. For example, with the light-transmissive adhesive member 19 containing a diffusing agent or the like, light emitted from the main light-emitting surface 11c of the light-emitting element 11 is diffused in the light-transmissive adhesive member 19 before entering the light-transmissive member 10, so that unevenness in luminance may be reduced.

The same member as a bonding member 14 described below may be used for the light-transmissive adhesive member 19.

First Light-Reflective Member 15

In addition, in the light-emitting element unit 3, the lateral surfaces of the light-emitting element 11 are covered with the first light-reflective member 15, with the light-transmissive member 10 disposed on the light-emitting element 11. In detail, the first light-reflective member 15 covers the lateral surfaces of the light-emitting element 11 not covered with the light-transmissive adhesive member 19, and the outer lateral surface of the light-transmissive adhesive member 19.

The first light-reflective member 15 is made of a material having good light reflectivity, and is preferably a white resin in which a light-reflective additive such as white powder is added to a transparent resin. In the light-emitting element unit 3, the first light-reflective member 15 covers the surfaces of the light-emitting element 11 other than the main light-emitting surface 11c to reduce leakage of light in the directions other than the direction toward the main light-emitting surface 11c. That is, light emitted from the lateral surfaces and the electrode formation surface 11d of the light-emitting element 11 is reflected at the first light-reflective member 15, which allows light emitted from the light-emitting element 11 to be effectively radiated to the outside through the first main surface 11c of the light-guiding plate 1, so that the light extraction efficiency of the light-emitting module 100 may be increased.

For the first light-reflective member 15, a white resin having a reflectance of 60% or more, preferably 90% or more, of light emitted from the light-emitting element 11 is preferable. The first light-reflective member 15 is preferably a resin containing a white pigment such as white powder. A silicone resin containing white inorganic powder such as titanium oxide is particularly preferable.

The first light-reflective member 15 is in contact with at least a portion of each of the lateral surfaces of the light-emitting element 11 and surrounds the light-emitting element 11 to embed the light-emitting element 11 such that the element electrodes 11b of the light-emitting element 11 are exposed on a surface of the first light-reflective member 15. The first light-reflective member 15 is in contact with the light-transmissive member 10, and each of the outer lateral surfaces of the first light-reflective member 15 and a respective one of the outer lateral surfaces of the light-transmissive member 10 are in the same plane. In the light-emitting element unit 3, the first light-reflective member 15 is bonded to the light-emitting element 11 and the light-transmissive member 10 so as to be an integrated structure, and the light-emitting element unit 3 is disposed on the light-guiding plate 1.

Light-Guiding Plate 1

The light-guiding plate 1 is a light-transmissive member from which light incident from the light source is surface-emitted to the outside. As shown in FIG. 3, the light-guiding plate 1 has the first main surface 1c serving as the light-emitting surface and the second main surface 1d opposite to the first main surface 1c. The light-guiding plate 1 defines a plurality of recesses 1b at the second main surface 1d. In the present embodiment, grooves 1e are formed between adjacent recesses 1b.

A portion of each light-emitting element unit 3 may be disposed in the corresponding recess 1b. More specifically, a portion of the light-emitting element unit 3 may be disposed in the recess 1b of the light-guiding plate 1 such that the light-transmissive member 10 faces the bottom surface of the recess 1b. This structure allows for reducing a thickness of an entirety of the light-emitting module. As shown in FIG. 2 and FIG. 3, the light-guiding plate 1 may have a plurality of recesses 1b, and each of the light-emitting element units 3 may be disposed in a respective one of the recesses 1b to constitute the light-emitting module 100.

Figure 4:
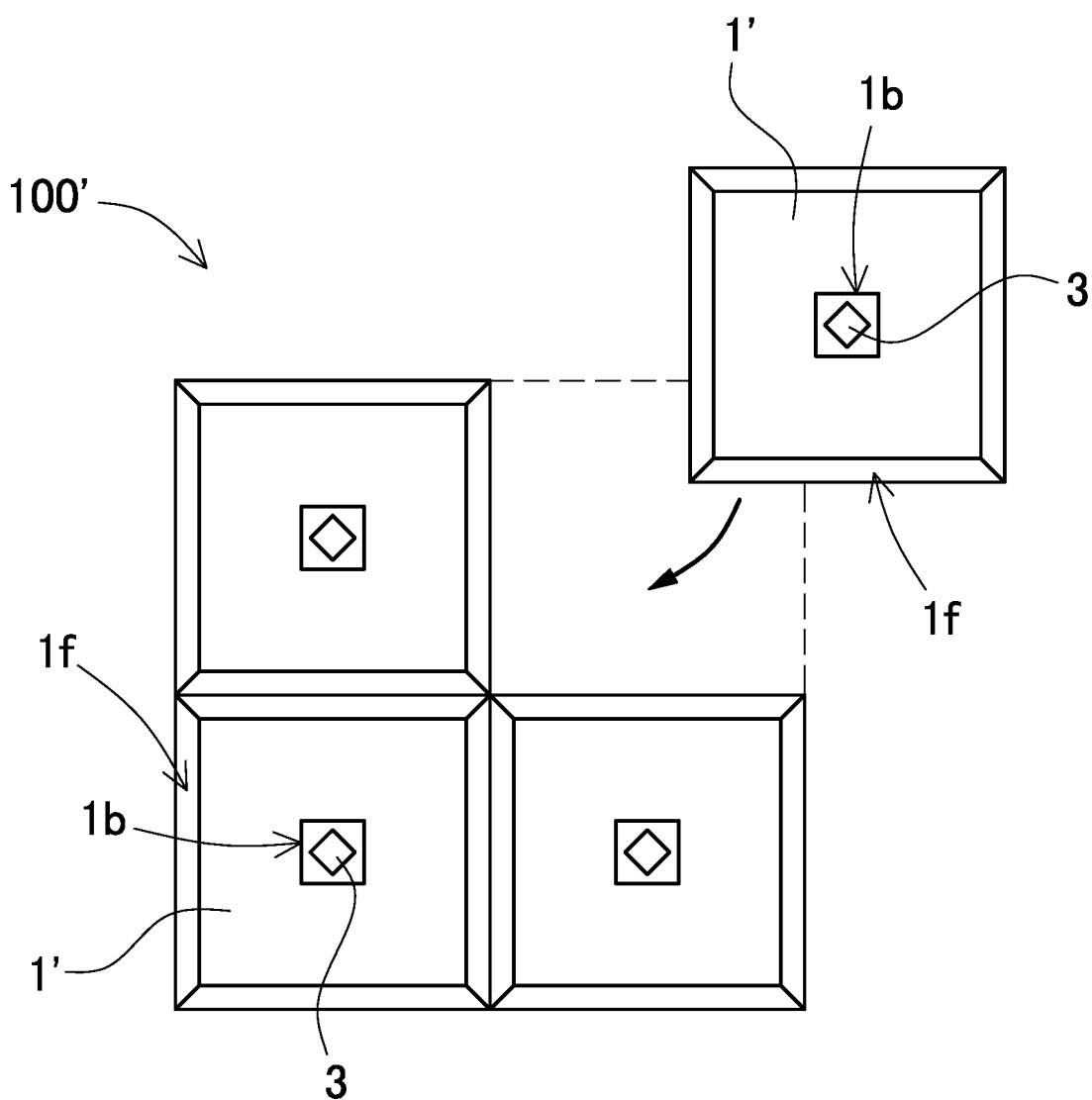
FIG. 4 is a schematic bottom view of a light-emitting module according to another embodiment.

Alternatively, as shown in FIG. 4, a plurality of light-guiding plates 1', each of which defines a single recess 1b in which a portion of a respective one of light-emitting element units 3 is disposed, may be arranged in a plane, which allows for constituting the light-emitting module 100'. The light-guiding plate 1 defining a plurality of recesses 1b has the grooves 1e in a lattice pattern, each of which is located between adjacent two of the recesses 1b, as shown in FIG. 3. The light-guiding plate 1' defining a single recess 1b has inclined surfaces 1f inclined toward the peripheral edges at the periphery of the second main surface 1d as shown in FIG. 4.

The second light-reflective member 16 is disposed on the surfaces of the grooves 1e and the inclined surfaces 1f. The second light-reflective member 16, which will be described below in detail, disposed in the grooves 1e is preferably a white resin that reflects light emitted from the light-emitting element units 3, and allows for preventing light emitted from the light-emitting elements 11 from being incident on an adjacent section of the light-guiding plate 1 divided by the grooves 1e, so that leakage of light emitted from each light-emitting element 11 to an adjacent section may be reduced. The second light-reflective member 16 bonded to the inclined surfaces 1f at the periphery of the second main surface 1d of each light-guiding plate 1' allows for preventing leakage of light to the surroundings of the light-guiding plate 1', so that reduction in the intensity of emission from the first main surface 1c of the light-guiding plate 1' may be prevented.

The size of the light-guiding plate 1 is appropriately selected according to the size of the liquid-crystal display device 1000, and each side of the light-guiding plate 1 is, for example, about 1 cm to 200 cm, preferably about 3 cm to 30 cm in the case of the light-guiding plate 1 having a plurality of recesses 1b. The light-guiding plate 1 may have a thickness in a range of about 0.1 mm to 5 mm, preferably 0.1 mm to 3 mm. The light-guiding plate 1 may have a planar shape of, for example, a substantially rectangular shape or a substantially circular shape.

For a material of the light-guiding plate 1, a resin material such as thermoplastic resins including acrylic resins, polycarbonates, cyclic polyolefins, poly(ethylene terephthalate), and polyesters, and thermosetting resins including epoxies and silicones or an optically transparent material such as glass may be used. Using a thermoplastic resin material allows efficient manufacture by using injection molding technique, and thus is preferable. Among these materials, polycarbonates, which are highly transparent and inexpensive, are preferable. In the manufacturing, even a thermoplastic material with a low thermal resistance such as polycarbonates may be used for a light-emitting module manufactured without being exposed to a high-temperature environment as with solder reflow.

The light-guiding plate 1 may be a single layer or may have a layered structure of a plurality of light-transmissive layers. In the case where a plurality of light-transmissive layers are layered, a layer with a refractive index different from a reflective index of the plurality of light-transmissive layers, such as an air layer, is preferably disposed between any layers of the plurality of light-transmissive layers. With this structure, diffusion of light is facilitated, and the light-emitting module with reduced unevenness in luminance may be obtained. Such a structure may be obtained by, for example, disposing a spacer between any light-transmissive layers of the plurality of light-transmissive layers to separate the corresponding light-transmissive layers such that an air layer is provided the corresponding light-transmissive layers. Alternatively, a light-transmissive layer may be disposed on the first main surface 1c of the light-guiding plate 1, and a layer with a refractive index different from the refractive index of the light-transmissive layer and the refractive index of the light-guiding plate 1, such as an air layer, may be disposed between the first main surface 1c of the light-guiding plate 1 and the light-transmissive layer. With this structure, diffusion of light is facilitated, and the liquid-crystal display device with reduced unevenness in luminance may be obtained. Such a structure may be obtained by, for example, disposing a spacer between the light-guiding plate 1 and the light-transmissive layer to separate from each other such that an air layer is provided.

Recess 1b

The light-guiding plate 1 has the recesses 1b on the second main surface 1d. A portion of each light-emitting element unit 3 is disposed in the corresponding recess 1b such that the light-transmissive member 10 faces the bottom surface of the recess 1b.

In a plan view, the lengths of the recess 1b are greater than the lengths of the light-emitting element unit 3.

More specifically, the inner lateral surfaces of the recess 1b are located outside the outer lateral surfaces of the light-emitting element unit 3 as shown in FIG. 3.

The inner lateral surfaces of the recess 1b may be inclined such that the inner lateral surfaces of the recess 1b is widened from the bottom surface of the recess 1b toward the second main surface 1d, as shown in the schematic cross-sectional view of FIG. 22 of a light-emitting module according to a modified example.

Figure 18:
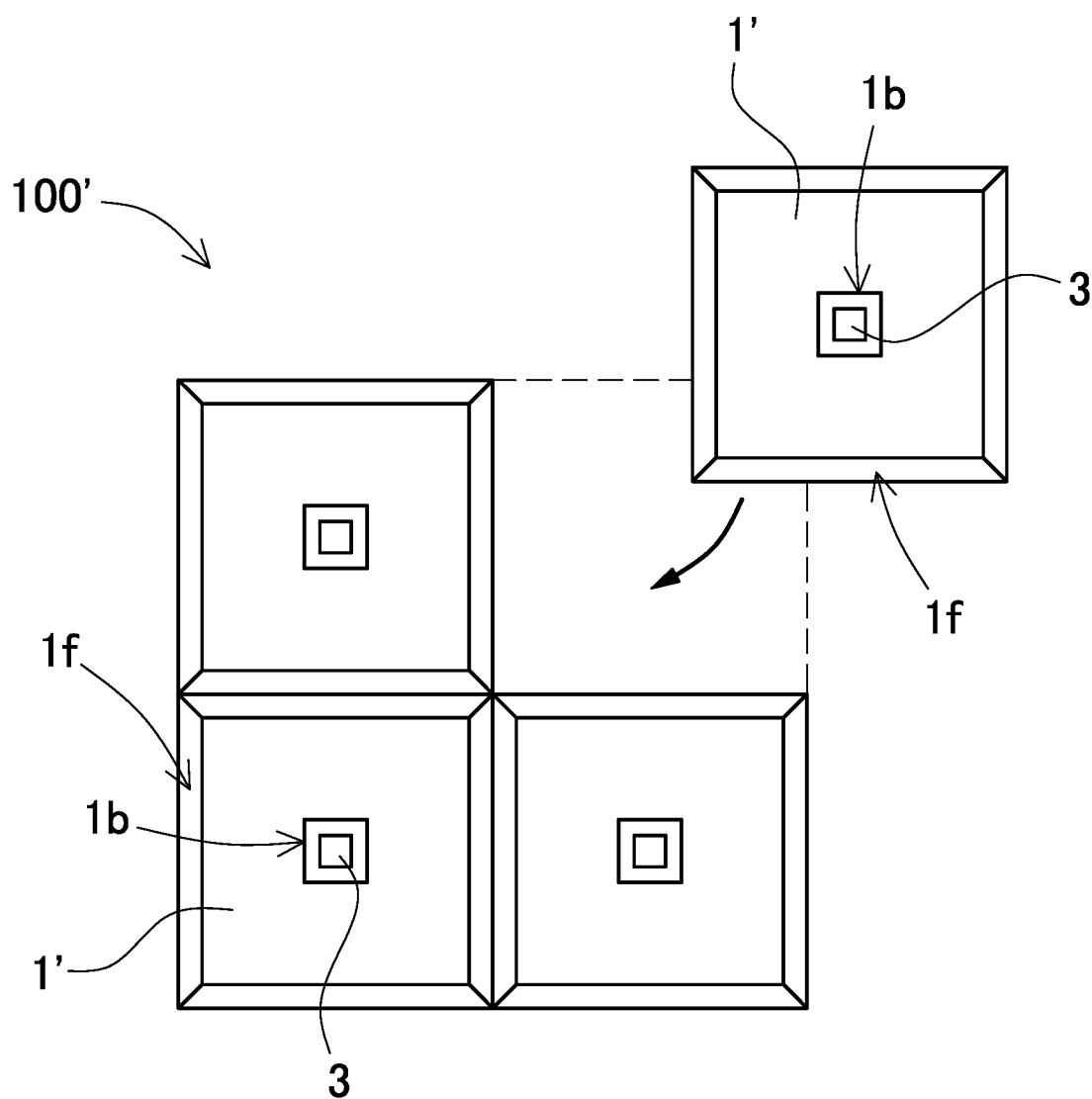
FIG. 18 is a schematic bottom view of a light-emitting module according to another modified example.

In the light-guiding plate 1 or 1' shown in FIG. 2 to FIG. 4, the recess 1b has a quadrangular shape, and the light-emitting element unit 3 to be disposed in the recess 1b also has a quadrangular shape in a plan view. Each outer lateral surface of the quadrangular light-emitting element unit 3 disposed in the quadrangular recess 1b may be parallel to a corresponding inner lateral surface of the recess 1b facing the outer lateral surface. It is more preferable that each outer lateral surface of the light-emitting element unit 3 be rotated 45° relative to a respective one of the inner lateral surfaces of the corresponding recess 1b as shown in FIG. 4. Further, it is preferable that the center of the bottom surface of each recess 1b substantially coincide with the center of a respective one of the light-emitting element units 3 in a plan view. This structure allows the distances from the lateral surfaces of the light-emitting element unit 3 to corresponding inner lateral surfaces of the recess 1b to be uniform, so that unevenness in emission color of the light-emitting module may be reduced. The light-emitting element unit having a quadrangular outer shape may be disposed such that each side intersects with the corresponding side of the quadrangular recess, in other words, such that the light-emitting element is rotated relative to the quadrangular recess. In the example shown in FIG. 4, the light-emitting element unit 3 is rotated 45° relative to the quadrangular recess about the center of the light-emitting element unit 3. Alternatively, each outer lateral surface of the light-emitting element unit 3 may be substantially parallel to the corresponding inner lateral surface of the recess 1b as shown in FIG. 18.

The size of each recess 1b in a plan view may be varied according to the outer shape of a corresponding light-emitting element unit 3. When the outer shape of the light-emitting element unit 3 is a circular shape, an elliptic shape, and a quadrangular shape, a diameter of the circle, a major axis of the elliptic shape, and a length of a diagonal line of the quadrangular shape, respectively, are, for example, in a range of 0.05 mm to 10 mm, preferably in a range of 0.1 mm to 2 mm. The depth of the recesses may be in a range of 0.05 mm to 4 mm, preferably 0.1 mm to 1 mm. The recess 1b may have, for example, a substantially rectangular or a substantially circular plan view shape, and the plan view shape of the recess 1b may be selected according to the intervals between the recesses 1b and the like. When the intervals between the recesses 1b (i.e., the distance between the centers of two adjacent recesses 1b) are substantially uniform, each recess 1b preferably has a substantially circular shape or a substantially square shape in a plan view. Among these shapes, with a substantially circular plan view shape, spread of light emitted from the light-emitting element unit 3 may be increased.

The recess 1b more preferably has a height (i.e., height from the bottom surface of the recess 1b to the second main surface 1d) that allows the main light-emitting surface 11c of the light-emitting element 11 and the second main surface 1d to be in the same plane in a cross-sectional view as shown in FIG. 3. The recess 1b may have a height that allows the upper surface of the light-emitting element 11 to be located at a position higher than the second main surface 1d when the light-emitting element 11 is mounted in the recess 1b. In this structure, the light-emitting element 11 is protruded from the recess 1b, so that the wiring operation of the element electrodes 11b and the like may be facilitated. The height of the recess 1b is preferably adjusted according to the height of the light-emitting element 11 as described above.

Bonding Member 14

Each light-transmissive bonding member 14 is in contact with the inner lateral surfaces of a respective one the recesses 1b and the outer lateral surfaces of a respective one of the light-emitting element units 3. Each bonding member 14 is disposed in contact with a portion of a respective one of the first light-reflective members 15 located outside a respective one of the recesses 1b, in other words, disposed so as to cover a region lying across the outer lateral surfaces of the light-transmissive member 10 and the outer lateral surfaces of the first light-reflective member 15. Further, an outer lateral surface of each bonding member 14 may be an inclined surface 14a. The inclined surfaces 14a form an acute inclination angle α with the outer lateral surface of the first light-reflective member 15.

Figure 20:
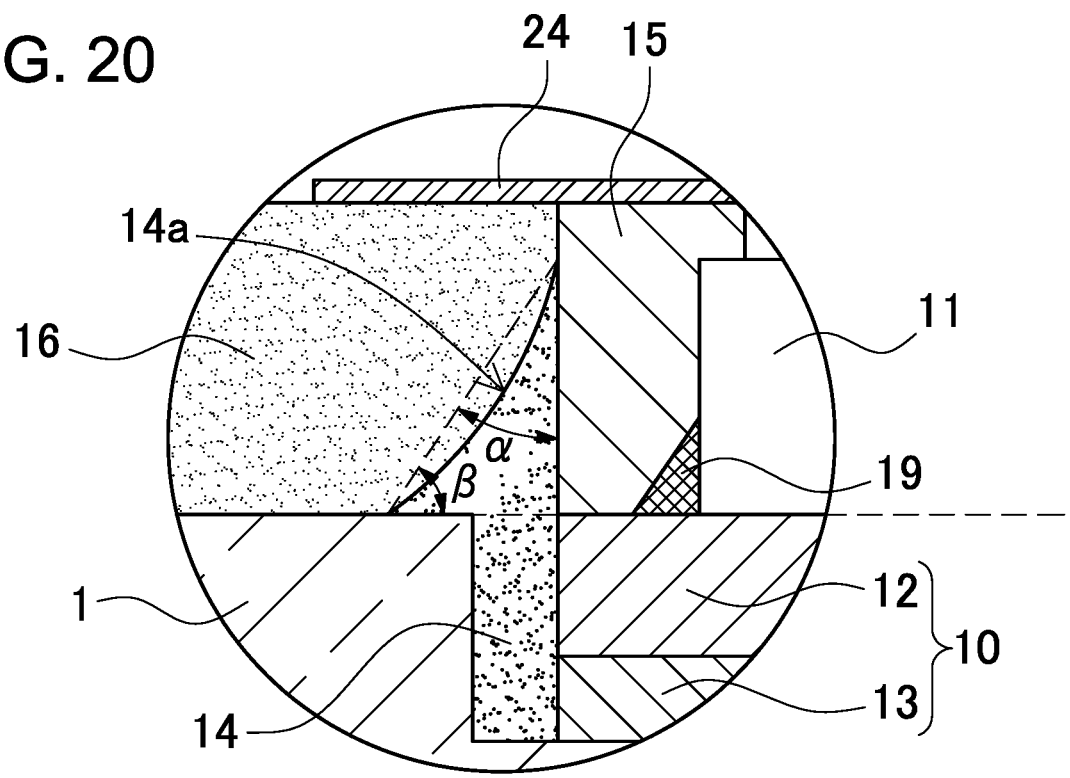
FIG. 20 is a schematic enlarged cross-sectional view for illustrating the inclination angle in the light-emitting module shown in FIG. 16.
Figure 21:
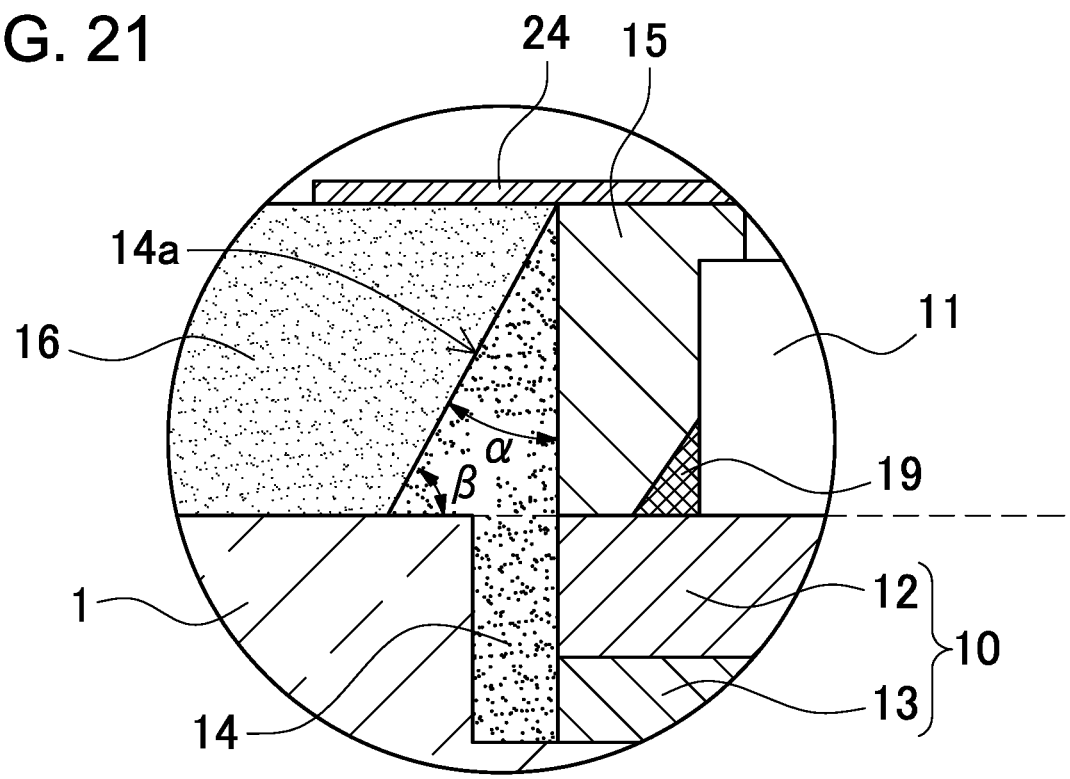
FIG. 21 is a schematic enlarged cross-sectional view for illustrating an inclination angle in the light-emitting module shown in FIG. 17.

An imaginary line indicating the upper end of each inner lateral surface of the recess 1b, that is, the position of the second main surface 1d, is indicated by a dashed line in each of cross-sectional views of the light-emitting module shown in FIG. 20 to FIG. 22. In the light-transmissive bonding member 14, the imaginary line indicating the upper end of each inner lateral surface of the recess 1b and the inclined surface 14a also form an acute inclination angle β. In the example shown in FIG. 22, provided that a line extending from an apex with the inclination angle α2 perpendicularly intersects with the imaginary line at a point A, the distance between an apex with the inclination angle β and the point A is longer than the distance between the apex with the inclination angle α and the point A. With the light-transmissive bonding member 14 covering a large area as described above, light incident on the bonding member 14 may be broadly guided to the light-guiding plate 1, and further allows for obtaining stability of emission color as an entirety of the light-emitting element module.

Each bonding member 14 may be disposed between the corresponding light-transmissive member 10 and the bottom surface of the corresponding recess 1b.

Figure 19:
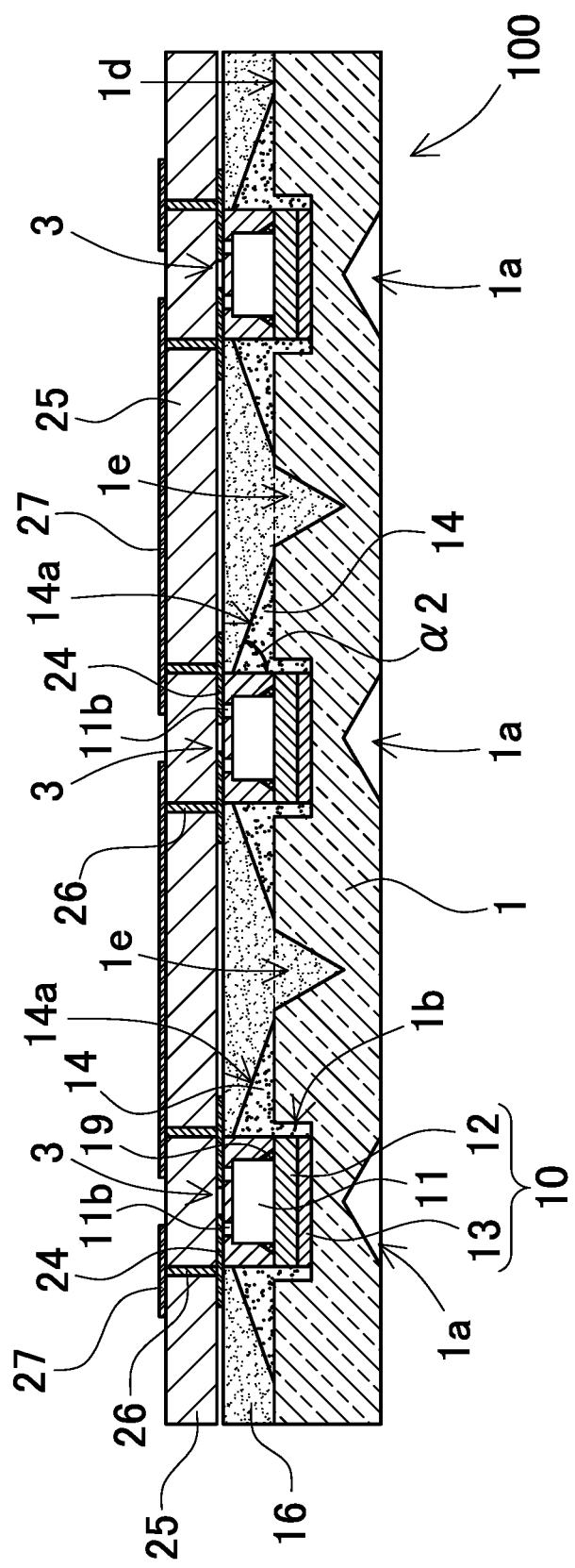
FIG. 19 is a schematic cross-sectional view of an illustrative light-emitting module having a different inclination angle.

In addition, the bonding members 14 are in contact with the second main surface 1d of the light-guiding plate 1 as shown in FIG. 3. This structure allows for increasing the area in which the inclined surface 14a is formed, increasing the amount of light to be reflected, so that unevenness in luminance may be reduced. The inclination angle α formed by the inclined surface 14a of the bonding member 14 and the outer lateral surface of the first light-reflective member 15 may be in a range of 5° to 85°, preferably 5° to 50°, more preferably 10° to 45°. FIG. 19 shows an example in which an inclination angle α2 is about 85° (for convenience of illustration, degree of the angle shown in the drawing does not coincide with the actual degree of the angle). Each bonding member 14 fills the gap inside the recess 1b between the inner lateral surfaces of the recess 1b and the outer lateral surfaces of the light-emitting element unit 3, and is widened toward the second main surface 1d of the light-guiding plate 1 such that a bottom portion of the bonding member 14 is in contact with the second main surface 1d of the light-guiding plate 1. A width dl between each outer lateral surface of the light-emitting element unit 3 and a corresponding one of the inner lateral surfaces of the recess 1b may vary according to the outer diameter of the recess 1b, the outer diameter of the light-emitting element unit 3, their shapes, the orientation of the light-emitting element unit 3 when mounted in the recess 1b, the tolerances of the mounting position of the light-emitting element unit 3, and the like. Further, the inclination angle α may also vary according to the height of the bonding member 14, that is, the height of the light-emitting element unit 3 (i.e., the height of the light-emitting element 11 and the thickness of the light-transmissive member 10) and the depth (i.e., height) of the recess 1b. Thus, the inclination angle α formed by the inclined surface 14a of the bonding member 14 widened toward the second main surface 1d and the outer lateral surface of the first light-reflective member 15 may be selected according to these conditions.

As shown in FIG. 3, the bonding member 14 has the inclined surface 14a in a cross-sectional view. With this shape, light transmitted through the bonding member 14 and incident on the inclined surface 14a may be uniformly reflected toward the light-emitting surface.

A light-transmissive thermosetting resin material such as epoxy resins or silicone resins may be used for the bonding member 14. The bonding member 14 has a light transmittance of 60% or more, preferably 90% or more. The bonding member 14 may contain a diffusing material or the like, or may contain white powder or the like that is a light-reflective additive. Alternatively, the bonding member 14 may be made of only a light-transmissive resin material containing no diffusing material or white powder.

Modified Examples of Inclined Surface 14a

Figure 5:
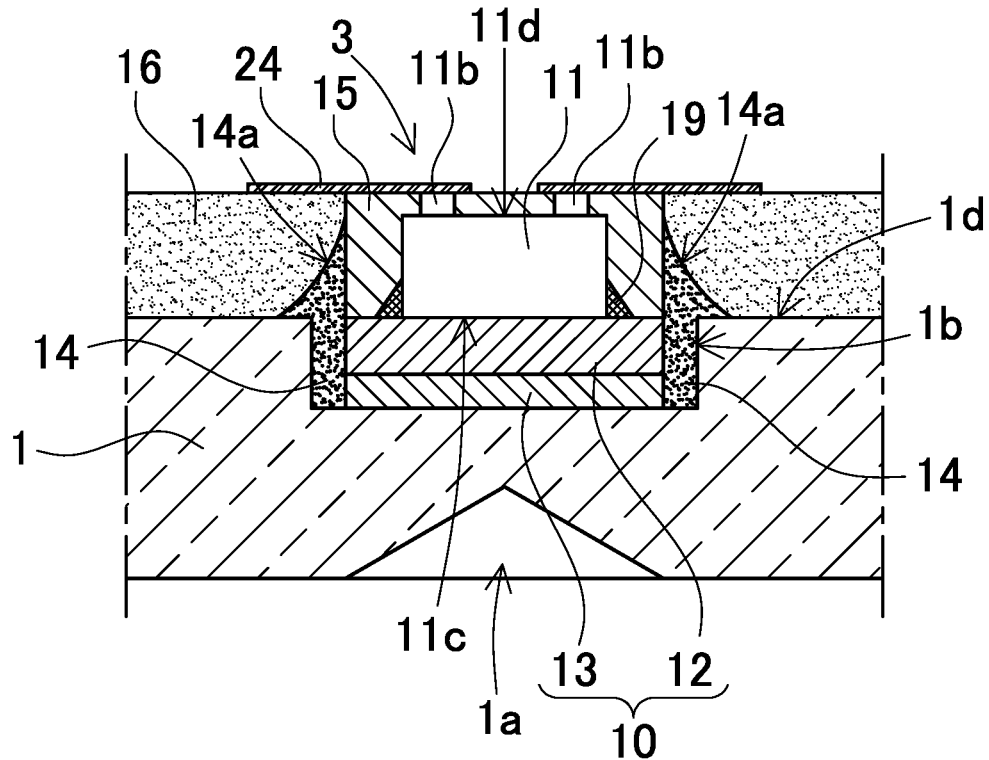
FIG. 5 is a schematic enlarged cross-sectional view of a light-emitting module according to still another embodiment.

The inclined surface 14a of the light-transmissive bonding member 14 may be a curved surface in a cross-sectional view. The inclined surface 14a of the bonding member 14 shown in FIG. 5 is a convex curved surface protruding toward the recess 1b. This inclined surface 14a allows for varying the directions of travel of light reflected at the inclined surface 14a, and reducing unevenness in luminance.

Figure 6:
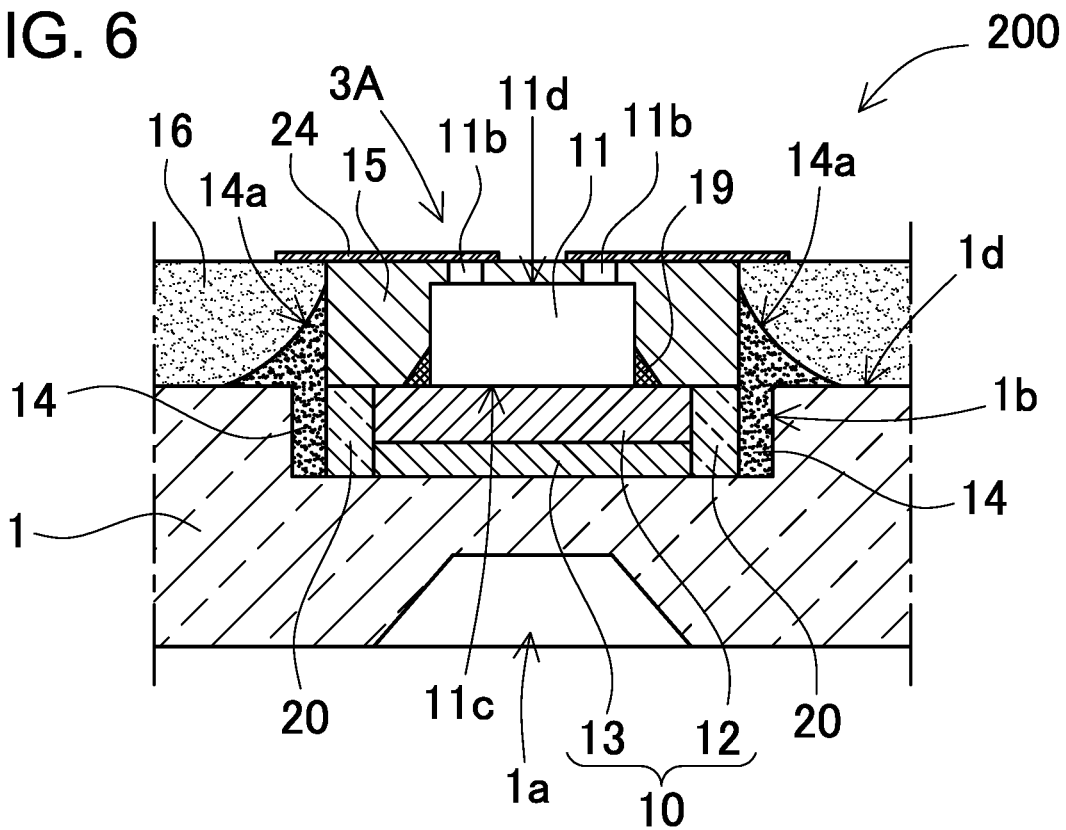
FIG. 6 is a schematic enlarged cross-sectional view of a light-emitting module according to even another embodiment.

The inclined surface 14a of the bonding member 14 shown in FIG. 6 covers a portion of the second main surface 1d of the light-guiding plate 1 such that an outer periphery of the inclined surface 14a in FIG. 6 is located at a position outer than an outer periphery of the inclined surface 14a shown in FIG. 5. It is preferable that the bonding member 14 cover a greater area of the second main surface 1d in a cross-sectional view. When a single light-guiding plate 1 is provided with a plurality of light-emitting element units 3, it is preferable that each bonding member 14 is not in contact with the bonding member 14 covering an adjacent light-emitting element unit 3.

This structure allows for increasing the area of the inclined surface 14a, so that reflection of light may be increased. Also for the bonding member 14 shown in this drawing, with the inclined surface 14a having a convex curved surface protruding toward the recess 1b in a cross-sectional view, reflected light may be diffused toward a broad region, so that unevenness in luminance may be reduced.

Figure 17:
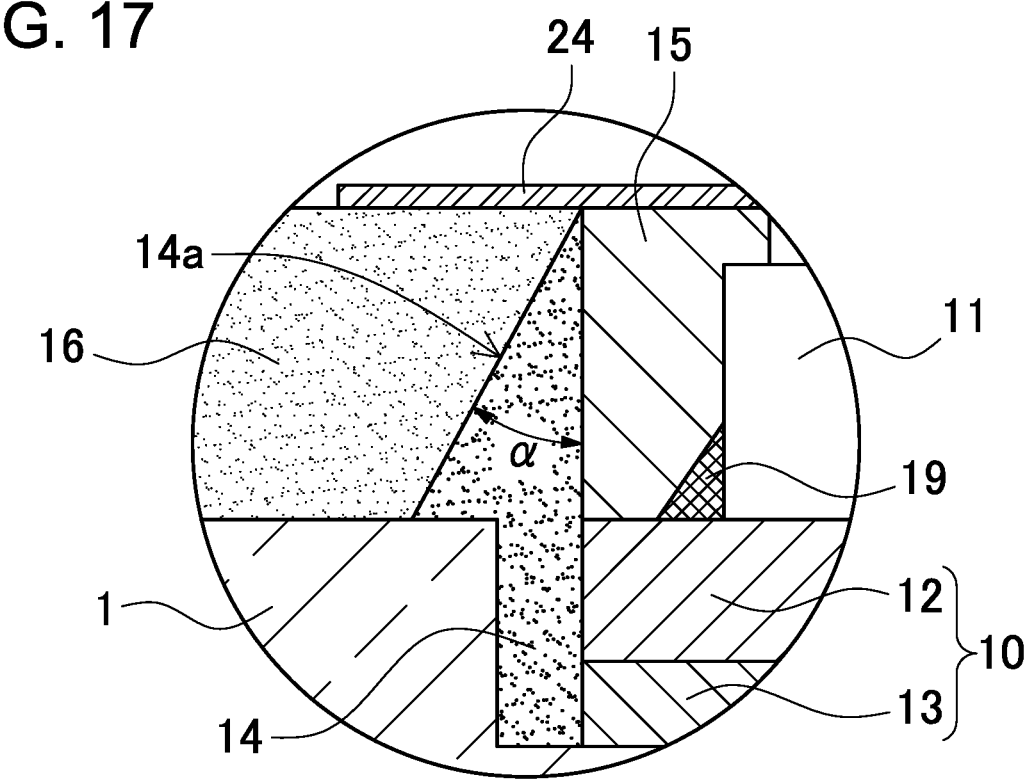
FIG. 17 is a schematic enlarged cross-sectional view of a light-emitting module according to a modified example.

The inclined surface 14a may cover the entire outer lateral surfaces of the first light-reflective member 15. In the example shown in FIG. 3 and other drawings, the inclined surface 14a covers a portion of the outer lateral surface of the first light-reflective member 15 other than the upper portion of the outer lateral surface, but the upper end of the inclined surface 14a may be located at the upper end of the first light-reflective member 15. Such an example is described in a modified example shown in FIG. 17. This structure allows light traveling in the lateral direction of the light-emitting element unit to be also reflected at the inclined surface 14a, and thus light may be greatly used, so that light may be spread further outward. When the upper portion of the first light-reflective member 15 is covered with the bonding member 14 that has crept up on the upper portion of the first light-reflective member 15, leakage of light may occur at the upper portion of the first light-reflective member 15. However, in the light emitting device according to the present variant example, with an electrically-conductive film 24 disposed above the upper portion of the first light-reflective member 15, leakage of light may be reduced using reflection at the electrically-conductive film 24.

A light-emitting module 200 shown in FIG. 6 further includes a light-transmissive resin member 20 on the outer lateral surfaces of the light-transmissive member 10 of a light-emitting element unit 3A. The light-transmissive resin member 20 may protect the outer lateral surfaces of the wavelength conversion member 12 and the light-diffusing member 13 in a step of singulation into the light-emitting units 3 described below. For example, a light-transmissive resin with a light transmittance of 60% or more, preferably 90% or more, may be used for the light-transmissive resin member 20. The first light-reflective member 15 of the light-emitting element unit 3A is in contact with the light-transmissive member 10 and the light-transmissive resin member 20.

Optical Functional Portion 1a

Figure 16:
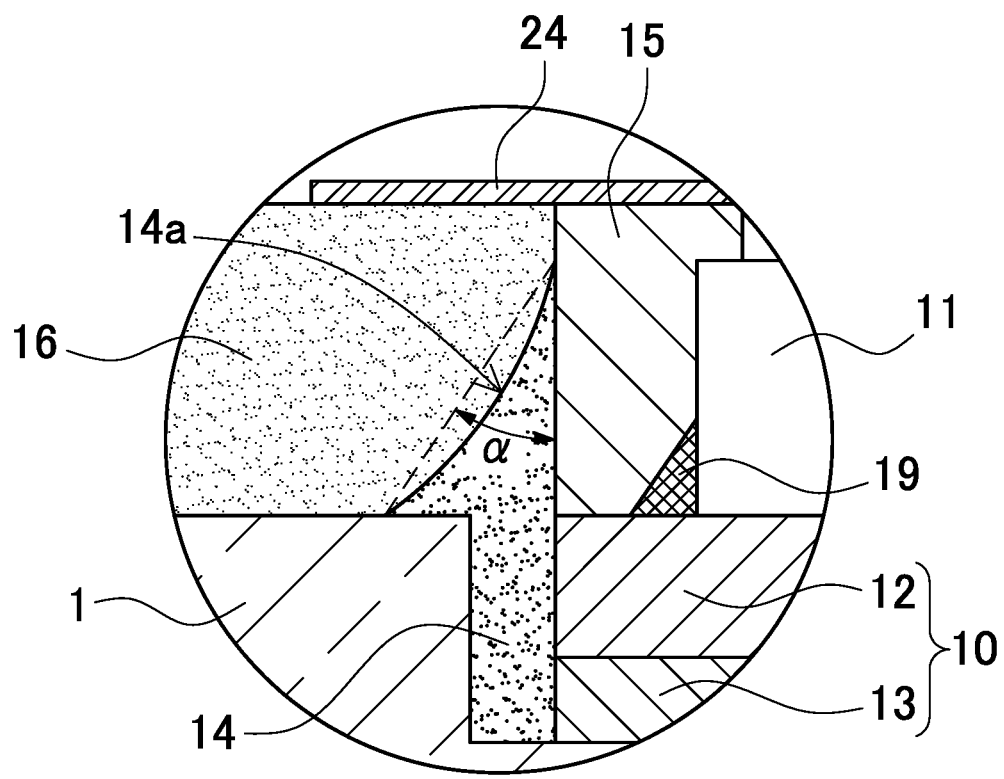
FIG. 16 is a schematic enlarged cross-sectional view for illustrating an inclination angle in the light-emitting module according to an embodiment of the present disclosure.

The light-guiding plate 1 may have, on the first main surface 1c, an optical functional portion 1a that has the functions of reflecting and diffusing light emitted from the light-emitting element unit 3. The light-guiding plate 1 having such a structure allows light emitted from the light-emitting element unit 3 to spread in the lateral direction, and allows the emission intensity in a plane of the light-guiding plate 1 to be uniform. The optical functional portion 1a may have the function of, for example, allowing light to spread in a plane of the light-guiding plate 1. For example, the optical functional portion 1a is a conical recess (see FIG. 3 and FIG. 5), a pyramidal recess such as a quadrangular-pyramidal recess or a hexagonal-pyramidal recess, a truncated conical recess (see FIG. 6), or a truncated pyramidal recess formed at the first main surface 1c side. The interface between the inclined surface of the recess of the optical functional portion 1a of the light-guiding plate 1 and a material with a refractive index different from a refractive index of the light-guiding plate 1 (such as air) inside the optical functional portion 1a may reflect incident light in the lateral direction of the light-emitting element unit 3. For example, the optical functional portion 1a may be a recess defined by an inclined surface(s) provided with a light-reflective material (such as a white resin and reflective film made of metal). The inclined surface of the optical functional portion 1a may be flat or curved in a cross-sectional view. FIG. 5 and FIG. 6 show examples in which the inclined surfaces 14a are curved surfaces. When the inclined surface 14a is a curved surface, the inclination angle α is formed by the outer lateral surface of the first light-reflective member 15 and the straight line (indicated by a dot-dash line in FIG. 16) connecting the upper end of the inclined surface 14a of the bonding member 14 covering the outer lateral surface of the first light-reflective member 15 and the outer periphery of a portion of the second main surface 1d of the light-guiding plate 1 covered with the inclined surface 14a, as shown in the enlarged view of FIG. 16.

Further, the depth of the recess, which is the optical functional portion 1a, may be selected in consideration of the depth of the recess 1b described above. That is, the optical functional portion 1a and the recess 1b may have any appropriate depth that allows the optical functional portion 1a and the recess 1b to be separated from each other.

As described below, the optical functional portion 1a is preferably disposed at a position corresponding to each light-emitting element unit 3, in other words, at a position opposite to the light-emitting element unit 3 disposed on the second main surface 1d. In particular, it is preferable that the optical axis of the light-emitting element unit 3 substantially coincide with the central axis of the optical functional portion 1a. This allows the center of the optical functional portion 1a disposed on the first main surface 1c to coincide with the center of the bottom surface of the recess 1b formed on the second main surface 1d. In this structure, disposing the light-emitting element unit 3 at the center of the recess 1b allows the optical axis of the light-emitting element unit 3 to easily coincide with the central axis of the optical functional portion 1a. The size of the optical functional portion 1a may be appropriately selected.

With the structure in which the light-guiding plate 1 has a plurality of recesses 1b and a plurality of optical functional portions 1a and each of the light-emitting element units 3 is disposed in a respective one of the recesses 1b, both the light-emitting element units 3 and the optical functional portions 1a may be arranged with high positional accuracy. Accordingly, the optical functional portions 1a allows light emitted from the light-emitting elements 11 to be uniform with high accuracy, so that a high-quality light source, having small unevenness in luminance and emission color, for a backlight may be obtained. With the light-guiding plate 1 having the optical functional portions 1a at the surface opposite to the recesses 1b in which the light-emitting element units 3 are disposed, disposing the optical functional portions 1a at positions corresponding to the recesses 1b in which the light-emitting element units 3 are disposed allows for facilitating alignment of the light-emitting elements 11 with the optical functional portions 1a, so that misalignment may be prevented.

In the light-emitting module 100 in which a plurality of light-emitting element units 3 are disposed on the light-guiding plate 1 defining a plurality of recesses 1b, the light-emitting element units 3 are two-dimensionally arranged in a plan view of the light-guiding plate 1. The light-emitting element units 3 are preferably disposed in the recesses 1b two-dimensionally arranged along two perpendicular directions, that is, in the x direction and the y direction, as shown in FIG. 2. Intervals $p_x$ in the x direction and intervals $p_y$ in the y direction between the recesses 1b in which the light-emitting element units 3 are disposed may be the same as in the example shown in FIG. 2, or may be different from each other. The two directions of the arrangement may not be perpendicular to each other. The intervals in the x and y directions are not limited to regular intervals but may be irregular intervals. For example, the recesses 1b, in each of which a respective one of the light-emitting element units 3 is disposed, may be arranged such that the intervals increase from the center of the light-guiding plate 1 toward its periphery. The expression "intervals between the light-emitting element units 3 disposed in the recesses 1b" refers to distances between the optical axes of the light-emitting element units 3, that is, distances between the centers of the light-emitting element units.

Second Light-Reflective Member 16

As shown in FIG. 3, the second light-reflective member 16 covers the second main surface 1d of the light-guiding plate 1 and the light-emitting element units 3. More specifically, the second light-reflective member 16 covers the second main surface 1d of the light-guiding plate 1, the inclined surfaces 14a of the light-transmissive bonding members 14, and portions of the outer lateral surfaces of the first light-reflective members 15 not covered with the bonding members 14.

The second light-reflective member 16 reflects light emitted from the light-emitting elements 11 and light entering the light-guiding plate 1, which allows for guiding light toward the first main surface 1c serving as the light-emitting surface for radiating light to the outside, so that light extraction efficiency may be increased. Further, with the second light-reflective member 16 layered on the light-guiding plate 1, the light-guiding plate 1 may be reinforced. Further, with the second light-reflective member 16 serving as both a member that protects the light-emitting elements 11 and a layer that reflects light incident on the second main surface 1d of the light-guiding plate 1, a thickness of the light-emitting module 100 may be reduced.

For the second light-reflective member 16, a material same as a material used for the first light-reflective member 15 described above, that is, a white resin in which a light-reflective additive such as white powder is added to a transparent resin, may be suitably used. The second light-reflective member 16 effectively radiates light emitted from the light-emitting elements 11 to the outside through the first main surface 1c of the light-guiding plate 1.

As in the first light-reflective member 15, a white resin having a reflectance of 60% or more, preferably 90% or more, of light emitted from the light-emitting elements 11 is suitably used for the second light-reflective member 16. The white resin is preferably a resin containing a white pigment such as white powder. A silicone resin containing white inorganic powder such as titanium oxide is particularly preferable. A relatively large amount of a material is used for a member covering a surface of the light-guiding plate 1, so that using an inexpensive material such as titanium oxide at a high content for a member covering a surface of the light-guiding plate 1 allows for reducing a price of the light-emitting module 100.

In the light-emitting module 100 described above, the light-guiding plate 1 defines the recesses 1b, and each of the light-emitting element units 3 is disposed in a respective one of the recesses 1b, so that a thickness of an entirety of the module may be reduced. Further, with the light-guiding plate 1 defining the recesses 1b in each of which a respective one of the light-emitting element units 3 is disposed, the accuracy in mounting of the light-emitting element units 3 on the light-guiding plate 1 is improved. In particular, with each light-emitting element unit 3, in which the wavelength conversion member 12 is bonded to the light-emitting element 11 such that the light-emitting element 11 and the light-transmissive member 10 form an integrated structure, disposed in a respective one of the recesses 1*b* of the light-guiding plate 1, the accuracy in mounting of the wavelength conversion members 12 and the light-emitting elements 11 on the light-guiding plate 1 may be improved, so that good light-emitting characteristics may be obtained. Further, in the light-emitting module 100 where light emitted from the light-emitting elements 11 is transmitted through the wavelength conversion members 12, guided to the light-guiding plate 1, and radiated to the outside, the light-emitting elements 11, the wavelength conversion members 12, and the light-guiding plate 1 may be precisely arranged, which allows for improving light-emitting characteristics of light radiated from the light-guiding plate 1 to the outside such as unevenness in emission color and unevenness in luminance, so that good light-emitting characteristics may be obtained.

With the light-transmissive bonding member 14 in contact with the outer lateral surfaces of the light-transmissive member 10, the inner lateral surfaces of the light-guiding plate 1, and the first light-reflective member 15 located outside the recess 1*b*, light emitted from the light-transmissive member 10 toward the second light-reflective member 16 in the lateral direction of the light-emitting element unit 3 may be guided more laterally outward, so that unevenness in luminance may be increased. Further, light emitted from the light-transmissive member 10 is more likely to be incident on the light-guiding plate 1, so that the light extraction efficiency may be increased.

Because the distance between a liquid-crystal panel and the light-emitting module is reduced in a direct-lit liquid-crystal display device, unevenness in emission color and unevenness in luminance of the light-emitting module may affect unevenness in emission color and unevenness in luminance of the liquid-crystal display device. Accordingly, reduction of unevenness in emission color and in luminance is desired for a light-emitting module for a direct-lit liquid-crystal display device. With the structure of the light-emitting module 100 of the present embodiment, unevenness in emission color and in luminance may be reduced, while maintaining a reduced thickness of the light-emitting module 100, such as 5 mm or less, 3 mm or less, and 1 mm or less.

In the embodiment described above, each light-emitting element unit 3 includes the light-transmissive member 10 including the wavelength conversion member 12 and the light-diffusing member 13. With a portion of each light-emitting element unit 3 disposed in a respective one of the recesses 1*b* of the light-guiding plate 1, light emitted from each light-emitting element 11 is transmitted through a corresponding wavelength conversion member 12 and a corresponding light-diffusing member 13 before entering the light-guiding plate 1. In the light-emitting module, the light-transmissive member of the light-emitting element unit may not necessarily include both the wavelength conversion member and the light-diffusing member. In the light-emitting module, for example, the light-transmissive member of the light-emitting element unit may include only the wavelength conversion member, and the light-diffusing member may be disposed on the bottom surface of the recess of the light-guiding plate.

Manufacturing Process of Light-Emitting Module 100

The light-emitting element units 3 are provided. FIG. 7A to FIG. 7C and FIG. 8A to FIG. 8C show a manufacturing process of the light-emitting element units 3 according to the first embodiment.

Figure 7A:
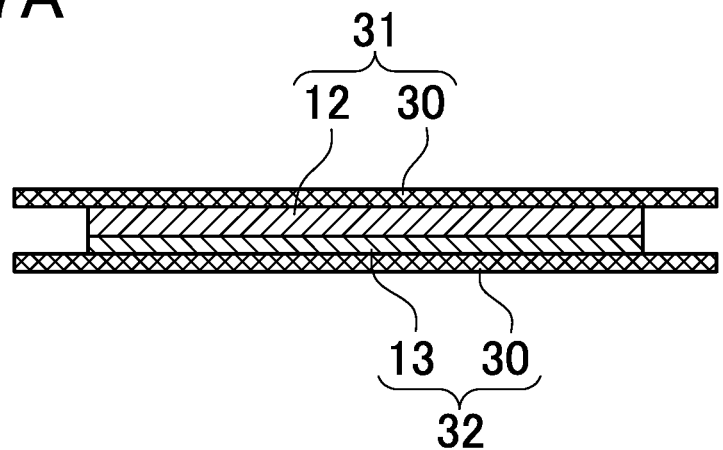
FIG. 7A to FIG. 7C are schematic enlarged cross-sectional views for illustrating an example of steps in a manufacturing process of a light-emitting unit according to an embodiment of the present disclosure.
Figure 7B:
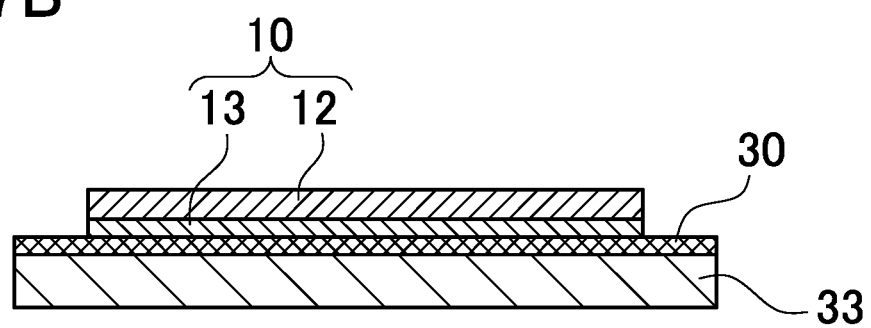

In steps shown in FIG. 7A and FIG. 7B, the light-transmissive member 10 covering the main light-emitting surfaces 11*c* of the light-emitting elements 11 is formed. The light-transmissive member 10 shown in the drawings is a layered body in which the wavelength conversion member 12 and the light-diffusing member 13 are layered.

In the step shown in FIG. 7A, a first sheet 31, in which the wavelength conversion member 12 with a uniform thickness is disposed on a surface of a base sheet 30, is layered on a second sheet 32, in which the light-diffusing member 13 with a uniform thickness is disposed on the surface of another base sheet 30, such that the wavelength conversion member 12 and the light-diffusing member 13 are bonded together. In the case where each of the wavelength conversion member 12 and the light-diffusing member 13 contain a thermosetting resin as the base material thereof, the wavelength conversion member 12 and the light-diffusing member 13 may be bonded together by layering the wavelength conversion member 12 and the light-diffusing member 13 in a semi-hardened state and then hardening the wavelength conversion member 12 and the light-diffusing member 13. The wavelength conversion member 12 and the light-diffusing member 13 may be bonded together using a light-transmissive bonding member. Each of the wavelength conversion member 12 and the light-diffusing member 13 may be attached to a respective one of the base sheets 30 via a respective one of adhesive layers therebetween so that the base sheets 30 may be removed from the wavelength conversion member 12 and the light-diffusing member 13.

In addition, in the step shown in FIG. 7B, the base sheet 30 of the second sheet 32 is removably disposed on a plate 33, and the base sheet 30 bonded to the wavelength conversion member 12 of the first sheet 31 is removed.

Figure 7C:
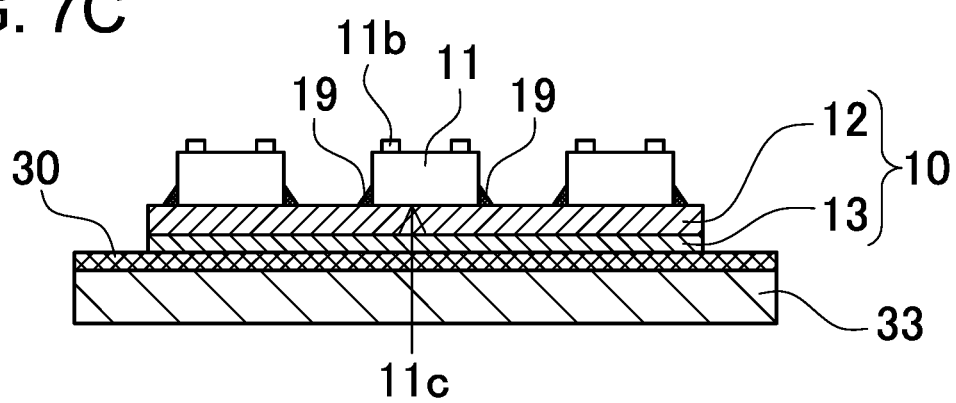

In a step shown in FIG. 7C, the light-emitting elements 11 are bonded to the light-transmissive member 10. The main light-emitting surfaces 11*c* of the light-emitting elements 11 are bonded to the light-transmissive member 10. In the case where the light-transmissive member 10 includes the wavelength conversion member 12 and the light-diffusing member 13, the light-emitting elements 11 are bonded to the wavelength conversion member 12 of the light-transmissive member 10 at predetermined intervals.

The light-emitting elements 11 are bonded to the light-transmissive member 10 via the light-transmissive adhesive members 19. The light-transmissive adhesive members 19 are applied on the light-transmissive member 10 and/or on the main light-emitting surfaces 11*c* of the light-emitting elements 11, to bond the light-emitting elements 11 to the light-transmissive member 10. At this time, the applied light-transmissive adhesive members 19 creep up the lateral surfaces of the light-emitting elements 11 to cover a portion of the lateral surfaces of the light-emitting elements 11 as shown in FIG. 7C. The light-transmissive adhesive members 19 may also be disposed between the light-transmissive member 10 and the main light-emitting surfaces 11*c* of the light-emitting elements 11.

Figure 8A:
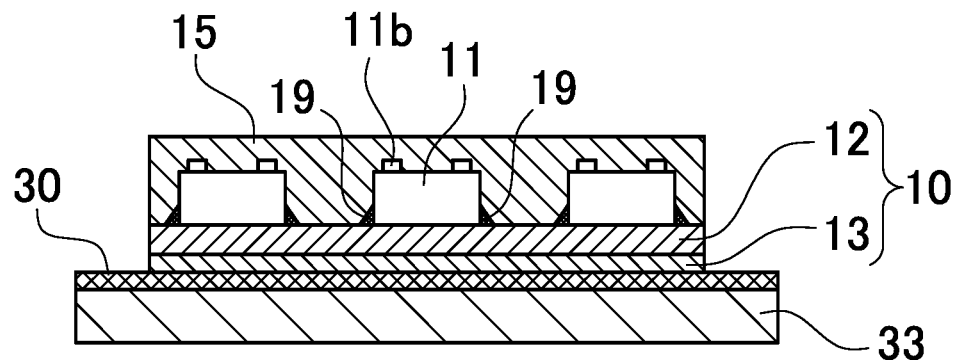
FIG. 8A to FIG. 8C are schematic enlarged cross-sectional views for illustrating an example of steps in a manufacturing process of the light-emitting unit according to the embodiment of the present disclosure.
Figure 8B:
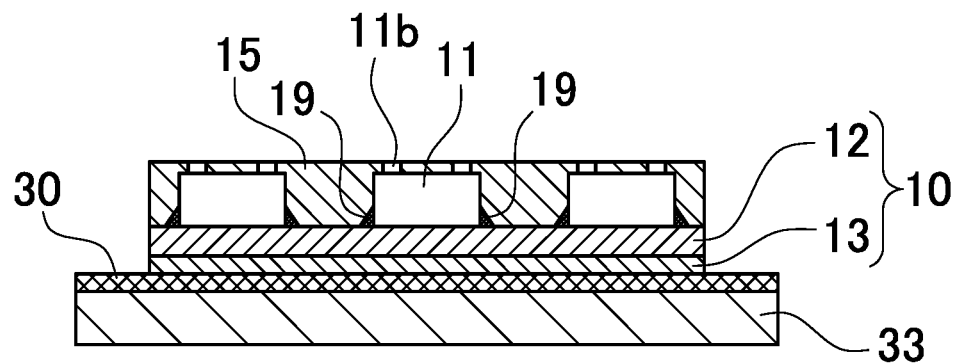
Figure 8C:
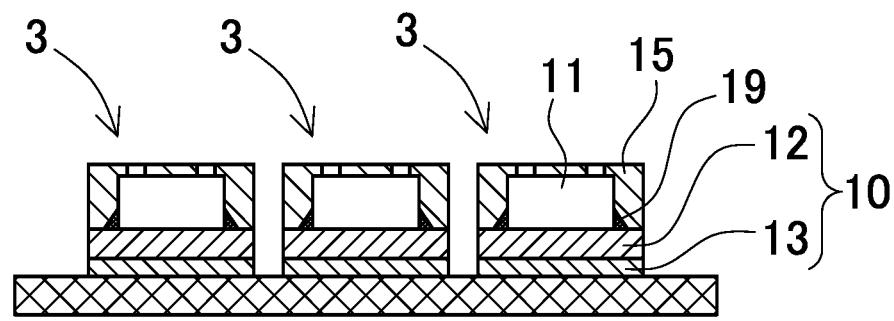

The gaps between the light-emitting elements 11 have dimensions that allow for obtaining light-transmissive members having an outer shape with a predetermined size by performing cutting between the light-emitting elements 11, as shown in FIG. 8C. The gaps between the light-emitting elements 11 determine the outer shapes of the light-transmissive members 10.

In a step shown in FIG. 8A, the first light-reflective member 15 is formed to embed the light-emitting elements 11. The first light-reflective member 15 is preferably a white resin. The first light-reflective member 15 is disposed on the light-transmissive member 10 and hardened in a state where the first light-reflective member 15 embeds the light-emitting elements 11. The first light-reflective member 15 has a thickness that allows an entirety of the light-emitting elements 11 to be embedded in the first light-reflective member 15. In FIG. 8A, the first light-reflective member 15 has a thickness that allows the element electrodes 11$b$ of the light-emitting elements 11 to be embedded in the first light-reflective member 15. The first light-reflective member 15 may be formed using a technique such as compression molding, transfer molding, and application.

In a step shown in FIG. 8B, a portion of the hardened first light-reflective member 15 is removed to expose the element electrodes 11$b$ of the light-emitting elements 11. Further, electrode-protective terminals, which are not shown in the drawings, may be formed, using an electrically-conductive film, on the element electrodes 11$b$ exposed from the first light-reflective member 15. In this case, the electrically-conductive film made of a material such as copper, nickel, and gold is disposed on the surface of the first light-reflective member 15 by sputtering or the like to be connected to the element electrodes 11$b$, and then a portion of the electrically-conductive film is removed, so that the electrically-conductive film is layered on the element electrodes 11$b$ to serve as the electrode protective terminals for the light-emitting element units 3. Removal of a portion of the electrically-conductive film may be performed by, for example, dry etching, wet etching, or laser ablation.

In a step shown in FIG. 8C, the first light-reflective member 15 and the light-transmissive member 10 are cut to perform singulation into the light-emitting element units 3. In each of the singulated light-emitting element units 3, the light-emitting element 11 is bonded to the light-transmissive member 10, the first light-reflective member 15 is disposed surrounding the light-emitting element 11, and the element electrodes 11$b$ are exposed at a surface of the first light-reflective member 15.

To provide the light-emitting element units, all or some of the steps described above may be performed, or the light-emitting element units may be purchased.

Each of the light-emitting element unit 3 manufactured as described above is bonded to a respective one of the recesses 1$b$ of the light-guiding plate 1, in steps shown in FIG. 9A to FIG. 9C and FIG. 10A to FIG. 100.

The light-guiding plate 1 having the recess 1$b$ on the second main surface 1$d$ is provided.

Figure 9A:
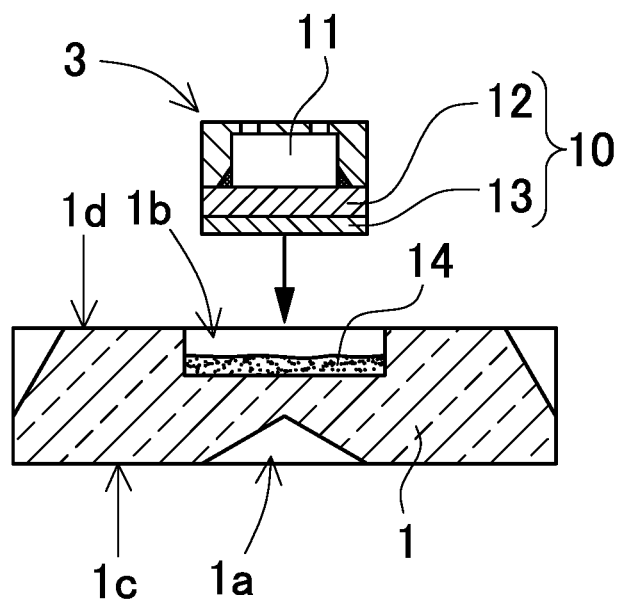
FIG. 9A to FIG. 9C are schematic enlarged cross-sectional views for illustrating an example of steps in a manufacturing process of the light-emitting module according to the embodiment of the present disclosure.
Figure 9B:
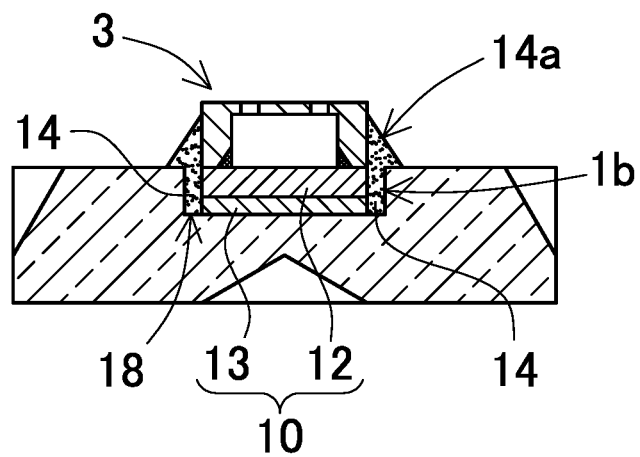

For example, the light-guiding plate 1 is made of a thermoplastic resin such as a polycarbonate, and defines the recesses 1$b$ at the second main surface 1$d$ as shown in FIG. 9A and FIG. 9B.

The light-guiding plate 1 may be molded using, for example, an injection molding technique, a transfer molding technique, or a compression molding technique. The light-guiding plate 1 is formed into a shape having the recesses 1$b$ using a mold, which allows mass-production at a low cost while reducing misalignment of the recesses 1$b$. The recesses may also be formed by, after shaping the light-guiding plate into a plate shape, performing cutting with an NC processing machine or the like. Further, for example, the conical optical functional portion 1$a$ may also be formed on the first main surface 1$c$.

Each of the light-emitting element units 3 is bonded to a respective one of the recesses 1$b$ of the light-guiding plate 1. The light-emitting element unit 3 is disposed in the recess 1$b$ in which the light-transmissive bonding member 14 in a liquid state has been applied. More specifically, each light-emitting element unit 3 is disposed such that the light-transmissive member 10 of the light-emitting element unit 3 faces the bottom surface of the recess 1$b$. A portion of each first light-reflective member is located outside a respective one of the recesses 1$b$.

The light-emitting element unit 3 is disposed such that the center of the light-transmissive member 10 coincides with the center of the recess 1$b$ in a plan view, and the bonding member 14 is hardened to be bonded to the light-guiding plate 1.

In a plan view, the lengths of the inner lateral surfaces of the recess 1$b$ are greater than the lengths of the outer lateral surfaces of the light-emitting element unit 3, which allows a clearance 18 between the inner lateral surfaces defining the recess 1$b$ and the outer lateral surfaces of the light-emitting element unit 3 when the light-emitting element unit 3 is disposed in the recess 1$b$. The clearance 18 is filled with the unhardened bonding member 14 applied in the recess 1$b$.

The amount of the bonding member 14 to be applied in the recess 1$b$ is adjusted such that the bonding member 14 is squeezed out of the clearance 18 between the inner lateral surfaces of the recess 1$b$ and the outer lateral surfaces of the light-emitting element unit 3 to the outside of the recess 1$b$. The bonding member 14 squeezed out of the recess 1$b$ creeps up to be in contact with a portion of the first light-reflective member 15 and covers the portion of the first light-reflective member 15. Further, the bonding member 14 spreads to be in contact with the second main surface 1$d$ and covers a portion of the second main surface 1$d$, such that an upper surface of the bonding member 14 is the inclined surface 14$a$ inclined outward from the upper end portion of the light-emitting element unit 3 in a perpendicular cross-sectional view. The inclined surface 14$a$ of the bonding member 14 and a corresponding outer lateral surface of the first light-reflective member 15 form an acute angle. The inclination angle α is preferably in a range of 5° to 50°.

The amount of the bonding member 14 applied in the recess 1$b$ may be such that the bonding member 14 covering the outer lateral surfaces of the light-emitting element unit 3 is located at a position higher than a position of the second main surface 1$d$ of the light-guiding plate 1, that is, such that the bonding member 14 overflows the recess 1$b$ outward, when the light-emitting element unit 3 is bonded to the recess 1$b$. The applied amount of the bonding member 14 is adjusted such that the position at which the inclined surface 14$a$ of the bonding member 14 is in contact with the outer lateral surface of the first light-reflective member 15 is below the edge of the outer lateral surface of the light-emitting element unit 3 on the electrode side.

Alternatively, after the light-emitting element unit 3 is bonded to the light-guiding plate 1, the unhardened bonding member 14 may be applied in the clearance 18 to cover a portion of the first light-reflective member 15. In other words, the bonding member 14 is applied at an amount such that the bonding member 14 is housed inside the recess 1$b$ when the light-emitting element unit 3 is disposed in the recess 1$b$. After that, the bonding member 14 is further applied to cover the outer lateral surfaces of the light-emitting element unit 3, specifically the outer lateral surfaces of the first light-reflective member 15. At this time, the applied amount of the bonding member 14 is such that the outer lateral surfaces of the light-emitting element unit 3 is not entirely covered by the bonding member 14. It is more preferable that the bonding member 14 be applied such that the bonding member 14 covers a portion of the second main surface 1d of the light-guiding plate 1.

Figure 9C:
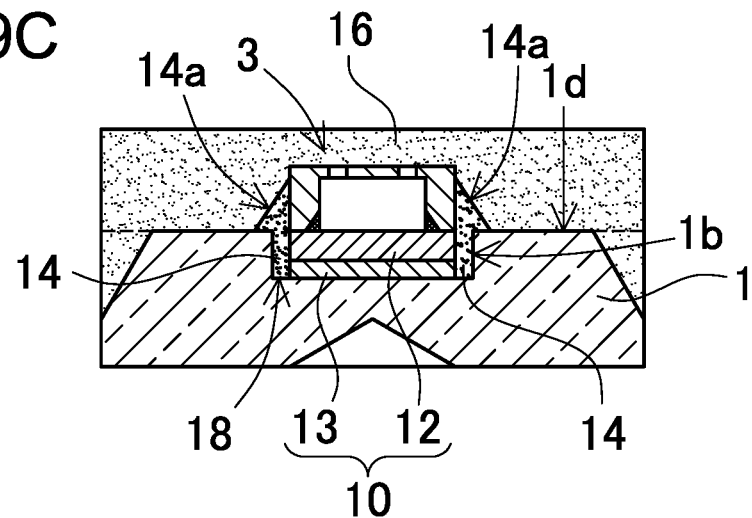

After the light-emitting element units 3 are disposed in the light-guiding plate 1, the second light-reflective member 16 is disposed on the second main surface 1d of the light-guiding plate 1 in a step shown in FIG. 9C. The second light-reflective member 16 has a thickness that allows the light-emitting element unit 3 to be embedded in the second light-reflective member 16.

Figure 10A:
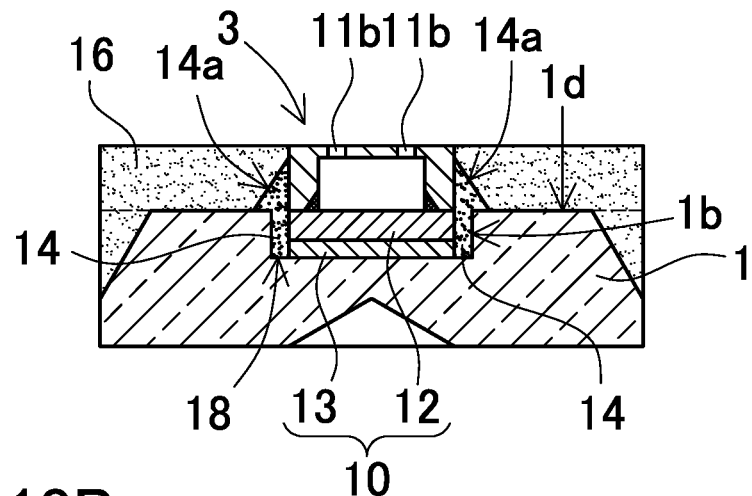
FIG. 10A to FIG. 10O are schematic enlarged cross-sectional views for illustrating an example of steps in a manufacturing process of the light-emitting module according to the embodiment of the present disclosure.

In a step shown in FIG. 10A, a portion of the hardened second light-reflective member 16 is removed to expose the element electrodes 11b on a surface of the second light-reflective member 16.

The second light-reflective member 16 is formed to have a thickness that allows the light-emitting element unit 3 to be embedded in the second light-reflective member 16 in the step shown in FIG. 9C, but the second light-reflective member 16 may be formed to have such a thickness that the surface is located in the same plane as corresponding surfaces of the element electrodes 11b or located below the surfaces of the element electrodes 11b, which allows for omitting the removal step described above.

Figure 10B:
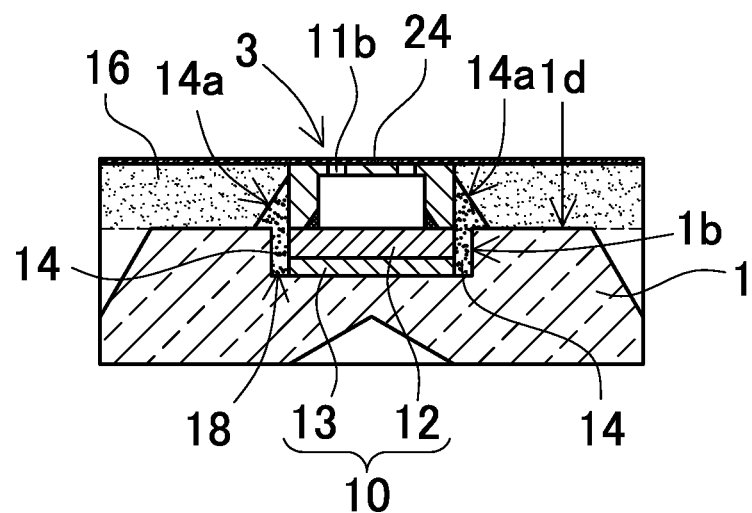

In a step shown in FIG. 10B, the electrically-conductive film 24 is layered on the surfaces of the second light-reflective member 16 and the first light-reflective member 15. In this step, for example, a Cu/Ni/Au electrically-conductive film 24 is formed by sputtering on substantially the entire surfaces of the element electrodes 11b of the light-emitting element 11, the first light-reflective member 15, and the second light-reflective member 16.

Figure 10C:
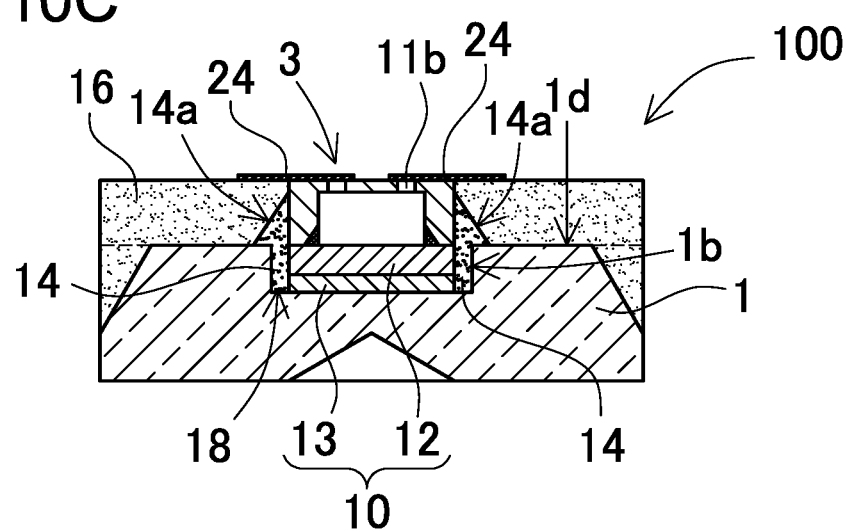

In a step shown in FIG. 10C, a portion of the electrically-conductive film 24 between the element electrodes 11b is removed.

The light-emitting module 100 in which one or more light-emitting element units 3 are disposed on a single light-guiding plate 1 is manufactured through the steps described above.

Method of Manufacturing Light-Emitting Module 200

The light-emitting element unit 3A of the light-emitting module 200 shown in FIG. 6 is manufactured as below.

Figure 11A:
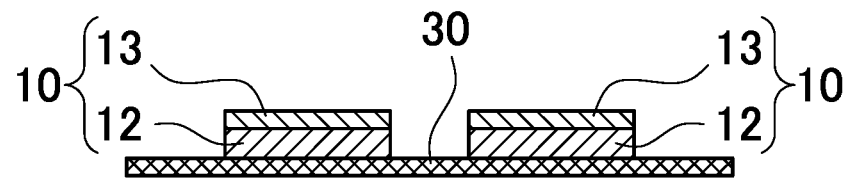
FIG. 11A to FIG. 11D are schematic enlarged cross-sectional views for illustrating an example of steps in a manufacturing process of light-emitting units according to another embodiment of the present disclosure.

The light-transmissive members 10 are disposed in a step shown in FIG. 11A. The light-transmissive members 10 shown in FIG. 11A are layered bodies in each of which the wavelength conversion member 12 and the light-diffusing member 13 that have predetermined sizes are layered.

Figure 11B:
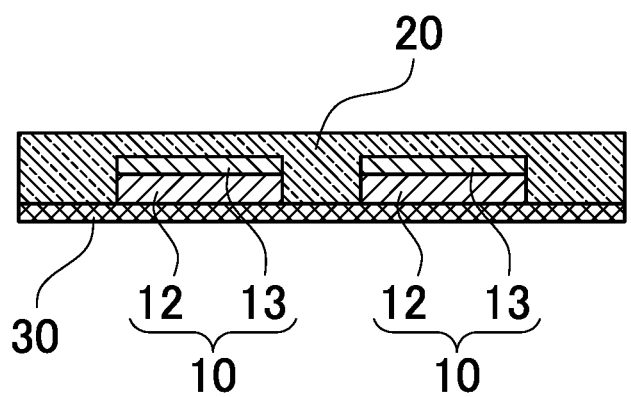
Figure 11C:
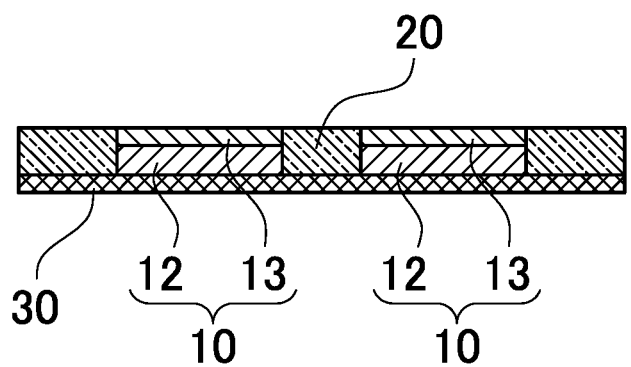

In a step shown in FIG. 11B, the light-transmissive resin member 20 is disposed to embed the light-transmissive members 10. Accordingly, the light-transmissive resin member 20 covers and protects the outer lateral surfaces of the wavelength conversion members 12 and the light-diffusing members 13. After that, in a step shown in FIG. 11C, a portion of the hardened light-transmissive resin member 20 is removed to expose the light-diffusing members 13.

Figure 11D:
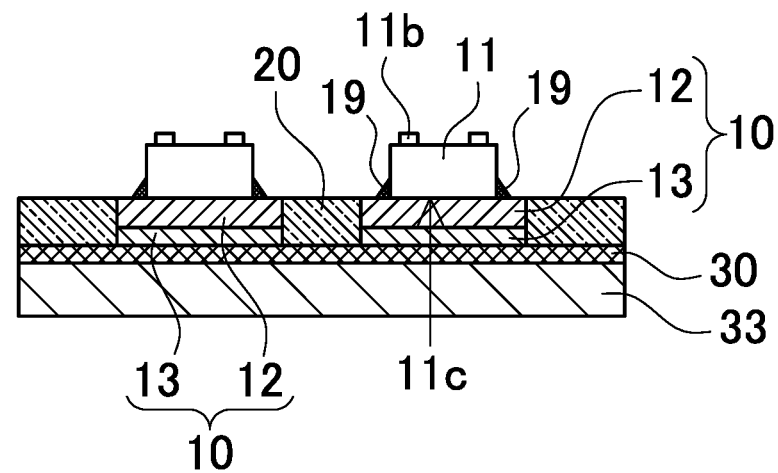

As shown in FIG. 11D, the light-transmissive members 10 are disposed such that the light-diffusing members 13 are in contact with the base sheet 30 disposed on the plate 33. After that, the light-emitting elements 11 are bonded to the light-transmissive members 10. The light-transmissive adhesive members 19 are applied on the light-transmissive members 10 and/or on the main light-emitting surfaces 11c of the light-emitting elements 11, and the main light-emitting surfaces 11c are bonded to the light-transmissive members 10. Each of the light-emitting elements 11 is bonded to the wavelength conversion member 12 of the corresponding light-transmissive member 10 such that the center of the main light-emitting surface 11c of the light-emitting element 11 substantially coincides with the center of the light-transmissive member 10 in a top view.

Figure 12A:
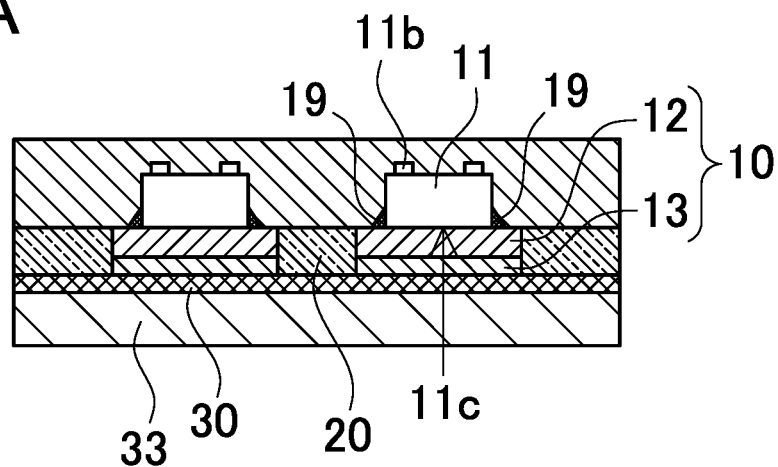
FIG. 12A to FIG. 12C are schematic enlarged cross-sectional views for illustrating an example of steps in a manufacturing process of the light-emitting units according to the other embodiment of the present disclosure.
Figure 12B:
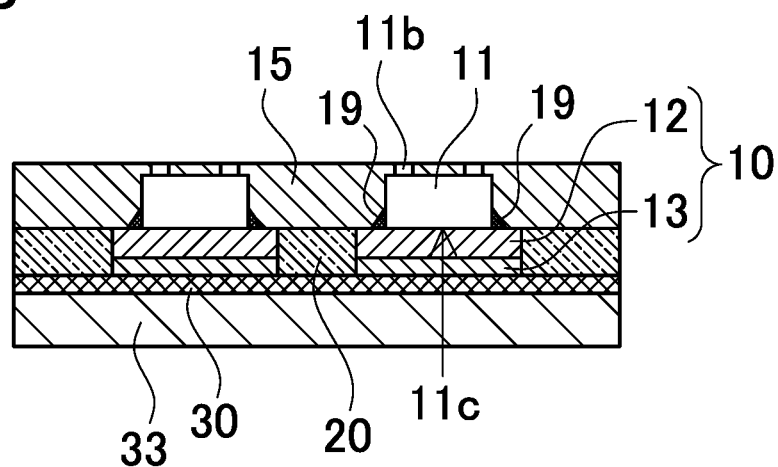

In a step shown in FIG. 12A, the first light-reflective member 15 is formed to embed the light-emitting elements 11. The first light-reflective member 15 is applied on the light-transmissive members 10 and hardened such that the first light-reflective member 15 embeds the light-emitting elements 11. After that, in a step shown in FIG. 12B, a portion of the hardened first light-reflective member 15 is removed to expose the element electrodes 11b of the light-emitting elements 11.

Figure 12C:
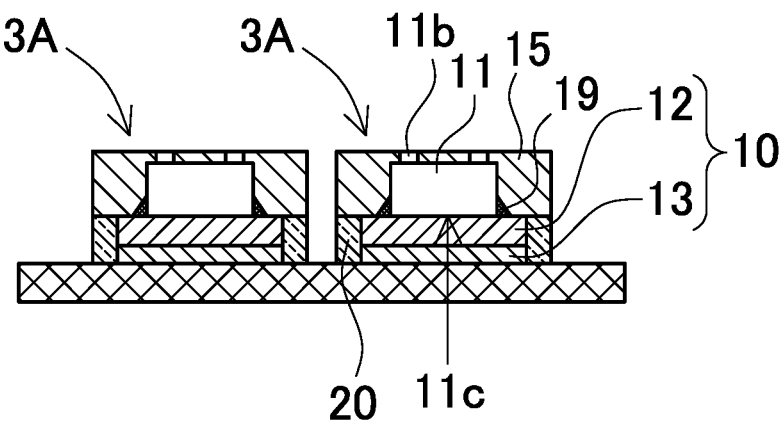

In a step shown in FIG. 12C, the first light-reflective member 15 and the light-transmissive resin member 20 are cut to perform singulation into the light-emitting element units 3A. In each of the singulated light-emitting element units 3A, the light-transmissive member 10, in which the outer peripheral surface of the layered body of the wavelength conversion member 12 and the light-diffusing member 13 is covered with the light-transmissive resin member 20, is bonded to the light-emitting element 11, and the first light-reflective member 15 is disposed surrounding the light-emitting element 11 such that the element electrodes 11b are exposed at a surface of the first light-reflective member 15.

In substantially the same manner as in the steps shown in FIG. 9A to FIG. 9C and FIG. 10A to FIG. 10C, the light-emitting element unit 3A manufactured through the steps described above is bonded to the recess 1b of the light-guiding plate 1, and the second light-reflective member 16 covering the second main surface 1d of the light-guiding plate 1 and the light-emitting element unit 3A is disposed, so that the light-emitting module 200 can be manufactured.

Another Method of Manufacturing

Figure 13A:
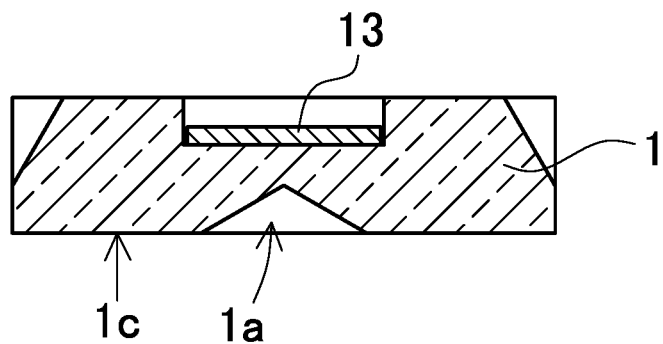
FIG. 13A to FIG. 13D are schematic enlarged cross-sectional views for illustrating an example of the manufacturing process of a light-emitting module according to the other embodiment of the present disclosure.
Figure 13B:
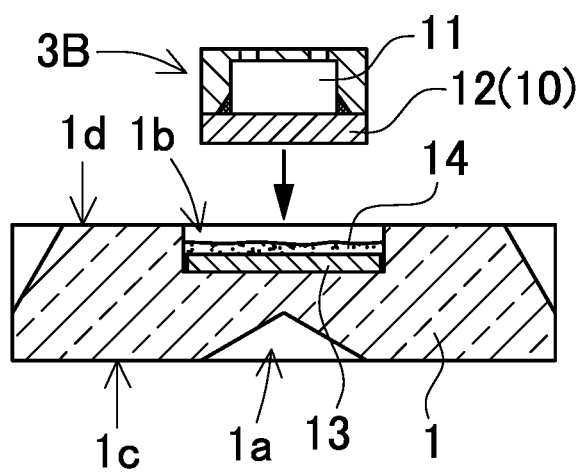
Figure 13C:
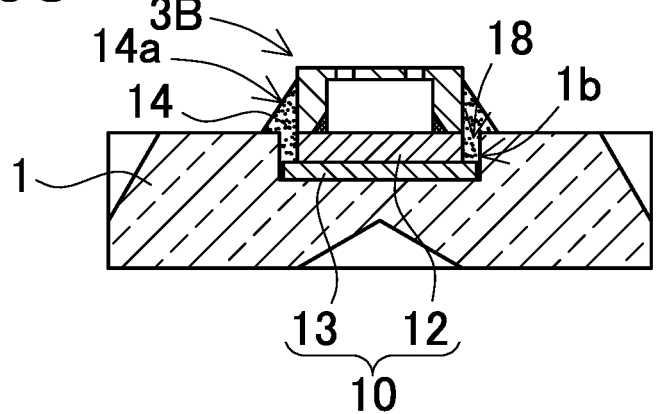
Figure 13D:
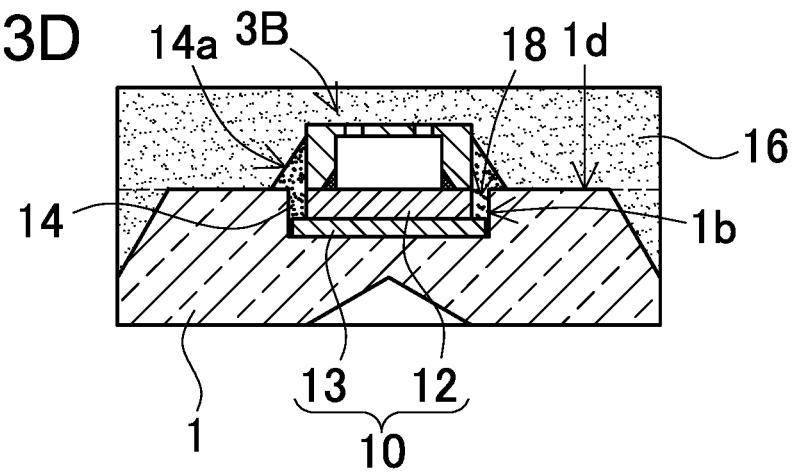
Figure 14:
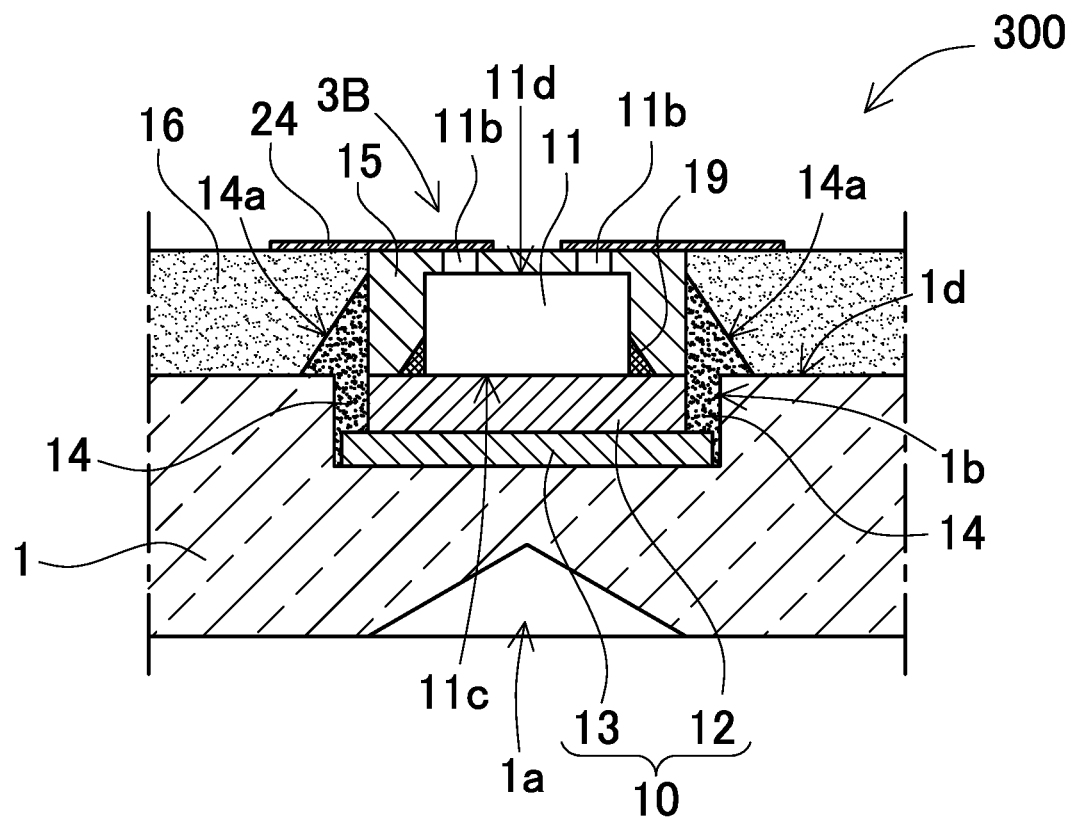
FIG. 14 is a schematic enlarged cross-sectional view of a light-emitting module according to the other embodiment.

FIG. 13A to FIG. 13D show a manufacturing process of a light-emitting module 300 shown in FIG. 14, in which a light-emitting element unit 3B including the light-transmissive member 10 constituted of only the wavelength conversion member 12 is used and the light-emitting element unit 3B is bonded to the recess 1b defined in the light-guiding plate 1. In the manufacturing process of the light-emitting module 300, the light-diffusing member 13 is disposed on the bottom surface of the recess 1b, in which the light-emitting element unit 3B is disposed. In the manufacturing process of the light-emitting element unit 3B, the light-emitting element 11 is bonded onto a surface of the wavelength conversion member 12, and then the first light-reflective member 15 is disposed on surfaces of the wavelength conversion member 12 and the light-emitting element 11 in substantially the same manner as in the steps shown in FIG. 8A to FIG. 8C, so that the light-transmissive member 10 including only the wavelength conversion member 12 is obtained.

The light-emitting module 300 is manufactured through the steps described above.

In a step shown in FIG. 13A, the light-diffusing member 13 is disposed on the bottom surface of the recess 1b of the light-guiding plate 1. For providing the light-diffusing member 13, a plate-shaped or sheet-shaped light-diffusing member formed to have a predetermined size is bonded to the bottom surface of the recess 1b or by printing, applying, or the like on the bottom surface of the recess 1b.

As shown in FIG. 13B, the light-emitting element unit 3B is bonded to the recess 1b, in which the light-diffusing member 13 has been disposed on a bottom surface defining the recess 1b. The light-emitting element unit 3B is disposed in the recess 1b in which the unhardened light-transmissive bonding member 14 in a liquid state has been applied such that the light-transmissive member 10 faces the light-diffusing member 13, and the bonding member 14 is hardened, so that the light-emitting element unit 3B is disposed on the light-guiding plate 1.

The unhardened bonding member 14 applied in the recess 1b is filled into the clearance 18 between the inner lateral surfaces of the recess 1b and the outer lateral surfaces of the light-emitting element unit 3B when the light-emitting element unit 3B is disposed in the recess 1b. At this time, the bonding member 14 is squeezed out of the recess 1b, so that the bonding member 14 is obtained. The bonding member 14, squeezed out of the recess 1b, creeps up to be in contact with a portion of the first light-reflective member 15 and covers the portion of the first light-reflective member 15 as described above, shown in FIG. 13C. Further, the upper surface of the bonding member 14 are formed into the inclined surfaces 14a inclined outward from the upper end portion of the light-emitting element unit 3B in a perpendicular cross-sectional view.

After the light-emitting element unit 3 is disposed on the light-guiding plate 1, the second light-reflective member 16 is disposed on the second main surface 1d of the light-guiding plate 1 in a step shown in FIG. 13D. The second light-reflective member 16 is made of a white resin and has a thickness that allows the light-emitting element unit 3 to be embedded in the second light-reflective member 16.

After that, as shown in FIG. 10A to FIG. 10O, a surface of the second light-reflective member 16 is polished to expose the element electrodes 11b, the electrically-conductive film 24 is layered on a surface of the second light-reflective member 16 and a surface of the first light-reflective member 15, and then a portion of the electrically-conductive film 24 is removed, so that the light-emitting module 300 having the structure shown in FIG. 14 is manufactured.

In the light-emitting module 100 of the present embodiment, a plurality of light-emitting element units 3 may be wired such that the plurality of light-emitting element units 3 are individually driven. It is also possible that the light-guiding plate 1 is divided into a plurality of regions, in each of which a plurality of light-emitting element units 3 are mounted and are electrically connected in series or in parallel to the same circuit. Such a structure allows for obtaining a light-emitting module with which local dimming can be performed.

The light-emitting module 100 of the present embodiment may be singly used as a backlight device for a liquid-crystal display device. Alternatively, a plurality of light-emitting modules 100 may be arranged to constitute a backlight for the liquid-crystal display device 1000. Producing a plurality of small light-emitting modules 100 and inspecting each of the plurality of small light-emitting modules 100 allows for improving the yield compared with the case of producing a large light-emitting module 100 in which many light-emitting elements 11 are mounted.

Figure 15:
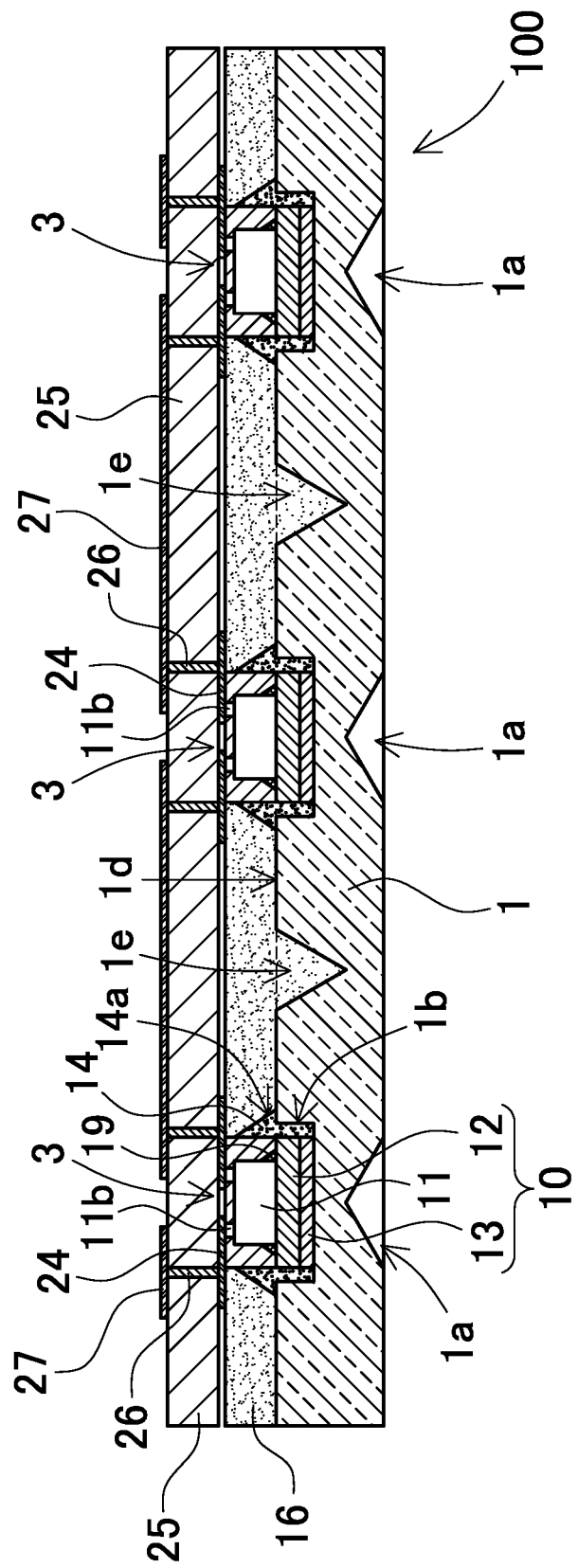
FIG. 15 is a schematic enlarged cross-sectional view for illustrating an example of connection of a circuit board to the light-emitting module shown in FIG. 3.

The light-emitting module 100 may include a wiring board 25 as shown in FIG. 15. The wiring board 25 includes, for example, an insulating base member defining a plurality of via holes, electrically-conductive members 26 each filled in a respective one of the plurality of via holes formed in the base member, and a wiring layer 27 electrically connected to the electrically-conductive members 26 on two opposite surface sides of the base member. The element electrodes 11b are electrically connected to the wiring board 25.

A single light-emitting module 100 may be bonded to a single wiring board, or a plurality of light-emitting modules 100 may be bonded to a single wiring board. With the plurality of light-emitting modules 100 bonded to a single wiring board, electrical connection terminals (such as connectors) to be connected to the outside can be concentrated (in other words, the electrical connection terminals are not required to be provided for respective light-emitting modules), so that the structure of the liquid-crystal display device 1000 can be simplified.

Also, a plurality of such wiring boards each bonded to a plurality of light-emitting modules 100 may be arranged to constitute a backlight device for the liquid-crystal display device 1000. In this structure, for example, a plurality of wiring boards can be disposed on a frame, and each of the plurality of wiring boards is connected to an external power supply using a connector.

A light-transmissive member having a function such as diffusing may be further layered on the light-guiding plate 1. In the case where the optical functional portion 1a is a depression, the light-transmissive member is preferably disposed such that the light-transmissive member blocks the opening (in other words, a portion close to the first main surface 1c of the light-guiding plate 1) of the depression but does not fill up the depression. This structure allows an air layer to be present in the depression of the optical functional portion 1a and can allow light emitted from the light-emitting element 11 to spread out well.

The light-emitting module according to the present disclosure can be suitably used for a backlight device for a television, a tablet, or a liquid-crystal display device, for a television, a tablet, a smartphone, a smartwatch, a head-up display, digital signage, or a bulletin board. The light-emitting module can also be used as a light source for lighting for an emergency light, a linear lighting, various illuminations, or vehicle installation.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:
1. A light-emitting module comprising:
a light-emitting element unit having outer lateral surfaces and a bottom surface, the light-emitting element unit comprising:
a light-emitting element having a main light-emitting surface and lateral surfaces,
a light-transmissive member covering the main light-emitting surface of the light-emitting element, and
a first light-reflective member covering the lateral surfaces of the light-emitting element;
a light-transmissive light-guiding plate having:
a first main surface serving as a light-emitting surface, and
a second main surface opposite to the first main surface and forming a recess accommodating the light-emitting element unit, the recess having inner lateral surfaces and a bottom surface;
a second light-reflective member covering the second main surface of the light-transmissive light-guiding plate and the light-emitting element unit; and a light-transmissive bonding member disposed in contact with the inner lateral surfaces and the bottom surface of the recess, as well as the outer lateral surfaces and the bottom surface of the light-emitting element unit, wherein at least a portion of the first light-reflective member is located outside the recess in a sectional view, and is in contact with the light-transmissive bonding member.

2. The light-emitting module according to claim 1, wherein the inclined surface is a curved surface in a cross-sectional view.

3. The light-emitting module according to claim 1, wherein the inclined surface is a convex curved surface protruding toward the recess.

4. The light-emitting module according to claim 1, wherein the light-transmissive bonding member is in contact with the second main surface of the light-transmissive light-guiding plate.

5. The light-emitting module according to claim 1, wherein the inclined surface forms an acute angle with an upper end of a corresponding one of the inner lateral surfaces of the recess in a cross-sectional view.

6. The light-emitting module according to claim 1, wherein the inner lateral surface of the recess is inclined such that the inner lateral surface of the recess is widened from the bottom surface of the recess toward the second main surface of the light-transmissive light-guiding plate.

7. The light-emitting module according to claim 5, wherein the inner lateral surface of the recess is inclined such that the inner lateral surface of the recess is widened from the bottom surface of the recess toward the second main surface of the light-transmissive light-guiding plate.

8. The light-emitting module according to claim 1, wherein an angle between the inclined surface and an outer lateral surface of the first light-reflective member is 5° to 50°.

9. The light-emitting module according to claim 1, wherein the light-transmissive member comprises a wavelength conversion member.

10. The light-emitting module according to claim 1, further comprising
a light-diffusing member at an interface between the light-emitting element unit and the bottom surface of the recess.

11. The light-emitting module according to claim 1, wherein the first main surface of the light-transmissive light-guiding plate comprises an optical functional portion having a recessed shape.

12. The light-emitting module according to claim 5, wherein the first main surface of the light-transmissive light-guiding plate comprises an optical functional portion having a recessed shape.

13. The light-emitting module according to claim 6, wherein the first main surface of the light-transmissive light-guiding plate comprises an optical functional portion having a recessed shape.

14. The light-emitting module according to claim 1, wherein a height from the bottom surface of the recess to the main light-emitting surface of the light-emitting element is substantially equal to a depth of the recess.

15. The light-emitting module according to claim 1, further comprising
a light-transmissive resin member on outer lateral surfaces of the light-transmissive member.

* * * * *